US010864720B2

(12) United States Patent
Yajima et al.

(10) Patent No.: US 10,864,720 B2
(45) Date of Patent: Dec. 15, 2020

(54) DRIVE CIRCUIT AND LIQUID EJECTING APPARATUS

(71) Applicant: SEIKO EPSON CORPORATION, Tokyo (JP)

(72) Inventors: Hidehiko Yajima, Matsumoto (JP); Tetsuo Takagi, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/751,252

(22) Filed: Jan. 24, 2020

(65) Prior Publication Data

US 2020/0238688 A1 Jul. 30, 2020

(30) Foreign Application Priority Data

Jan. 25, 2019 (JP) .................................. 2019-010962

(51) Int. Cl.
*B41J 2/045* (2006.01)
*G01R 31/317* (2006.01)

(52) U.S. Cl.
CPC ......... *B41J 2/04541* (2013.01); *B41J 2/0451* (2013.01); *B41J 2/0452* (2013.01); *B41J 2/04581* (2013.01); *G01R 31/31715* (2013.01)

(58) Field of Classification Search
CPC .......................... B41J 2/04508; B41J 2/04515; B41J 2/04516; B41J 2/04588; B41J 2/04525; B41J 2/04535; B41J 2/04573; B41J 2/04541; B41J 2/0459; B41J 2/04591; B41J 2/04581; B41J 2/04593; B41J 2/04595; B41J 2/04596; B41J 2/0452; B41J 2/0451
See application file for complete search history.

(56) References Cited

U.S. PATENT DOCUMENTS

| | | | |
|---|---|---|---|
| 2015/0231907 A1* | 8/2015 | Otokita | B41J 2/16579 347/10 |
| 2016/0221331 A1 | 8/2016 | Sano | |
| 2017/0225454 A1* | 8/2017 | Yoshida | B41J 2/0451 |
| 2018/0272700 A1* | 9/2018 | Ito | B41J 2/1433 |
| 2019/0193394 A1* | 6/2019 | Suzuki | B41J 2/0451 |

FOREIGN PATENT DOCUMENTS

JP 2016-141070 A 8/2016

* cited by examiner

*Primary Examiner* — Kristal Feggins
(74) *Attorney, Agent, or Firm* — Oliff PLC

(57) ABSTRACT

There is a provided a drive circuit in which a first drive signal output circuit includes a first control circuit that controls an output of a first drive signal, and a first abnormality detection circuit that detects an abnormality in a first drive signal output circuit, a second drive signal output circuit includes a second control circuit that controls an output of a second drive signal, and a second abnormality detection circuit that detects an abnormality in a second drive signal output circuit, the first drive signal output circuit transmits an occurrence of abnormality to the second drive signal output circuit, when the first abnormality detection circuit detects the abnormality, and the second drive signal output circuit transmits an occurrence of abnormality to the first drive signal output circuit, when the second abnormality detection circuit detects the abnormality.

8 Claims, 14 Drawing Sheets

|   |    | LARGE DOT | MEDIUM DOT | SMALL DOT | SLIGHT VIBRATION |
|---|----|-----------|------------|-----------|------------------|
| [SIH, SIL] | | [1, 1] | [1, 0] | [0, 1] | [0, 0] |
| S | T1 | H | H | L | L |
|   | T2 | H | L | H | L |
|   | T3 | L | L | L | H |

DRIVE CIRCUIT AND LIQUID EJECTING APPARATUS

The present application is based on, and claims priority from JP Application Serial Number 2019-010962, filed Jan. 25, 2019, the disclosure of which is hereby incorporated by reference herein in its entirety.

BACKGROUND

1. Technical Field

The present disclosure relates to a drive circuit and a liquid ejecting apparatus.

2. Related Art

As a liquid ejecting apparatus such as an ink jet printer that ejects an ink to print an image or a document, for example, an apparatus using a piezoelectric element such as a piezo element is known. The piezoelectric element is provided corresponding to each of a plurality of nozzles in a head unit, and each is driven according to a drive signal. As a result, a predetermined amount of liquid is ejected from the nozzles at a predetermined timing, and dots are formed on a print medium. Such a piezoelectric element is a capacitive load such as a capacitor when viewed electrically, and therefore, it is necessary to supply a sufficient current to drive the piezoelectric element corresponding to each of the nozzles. Therefore, in the liquid ejecting apparatus described above, the drive signal amplified by an amplifier circuit is supplied to the head unit, and the drive of the piezoelectric element is controlled by controlling the supply of the drive signal to the piezoelectric element.

In the liquid ejecting apparatus 1 as described above, there is known a liquid ejecting apparatus that includes a plurality of drive circuits, each of a plurality of drive circuits generates a drive signal for driving the piezoelectric element, and outputs the drive signal to the corresponding piezoelectric element. For example, in JP-A-2016-141070, a liquid ejecting apparatus that enables multi-tone printing by having two drive circuits generating drive signals to drive the piezoelectric elements, generating a drive signal from each of the two drive circuits, and outputting the drive signal to a corresponding piezoelectric element is disclosed.

However, a printing apparatus described in JP-A-2016-141070 does not disclose a technique for controlling the other drive circuit in which an abnormality does not occur when an abnormality occurs in one of the two drive circuits, and there is room for improvement.

SUMMARY

According to an aspect of the present disclosure, there is provided a drive circuit including a first drive signal output circuit that outputs a first drive signal for driving a first piezoelectric element, and a second drive signal output circuit that outputs a second drive signal for driving a second piezoelectric element, in which the first drive signal output circuit includes a first control circuit that controls an output of the first drive signal, and a first abnormality detection circuit that detects an abnormality in the first drive signal output circuit, the second drive signal output circuit includes a second control circuit that controls an output of the second drive signal, and a second abnormality detection circuit that detects an abnormality in the second drive signal output circuit, the first drive signal output circuit transmits an occurrence of abnormality to the second drive signal output circuit, when the first abnormality detection circuit detects the abnormality, and the second drive signal output circuit transmits an occurrence of abnormality to the first drive signal output circuit, when the second abnormality detection circuit detects the abnormality.

In one aspect of the drive circuit, the first control circuit may perform control to stop the output of the first drive signal, when the first abnormality detection circuit detects the abnormality, and the second control circuit may perform control to stop the output of the second drive signal, when the second abnormality detection circuit detects the abnormality.

In one aspect of the drive circuit, the second control circuit may perform control to stop the output of the second drive signal, when the first abnormality detection circuit detects the abnormality and the occurrence of abnormality is transmitted from the first drive signal output circuit to the second drive signal output circuit, and the first control circuit may perform control to stop the output of the first drive signal, when the second abnormality detection circuit detects the abnormality and the occurrence of abnormality is transmitted from the second drive signal output circuit to the first drive signal output circuit.

In one aspect of the drive circuit, the first control circuit and the first abnormality detection circuit may be provided in a first integrated circuit, and the second control circuit and the second abnormality detection circuit may be provided in a second integrated circuit.

In one aspect of the drive circuit, the first integrated circuit may include a first oscillation circuit that outputs a first oscillation signal, the second integrated circuit may include a second oscillation circuit that outputs a second oscillation signal, the first control circuit may perform control to stop the output of the first drive signal based on the first oscillation signal, and the second control circuit may perform control to stop the output of the second drive signal based on the second oscillation signal.

In one aspect of the drive circuit, the drive circuit further may include a third oscillation circuit that outputs a third oscillation signal, in which the first control circuit may perform control to stop the output of the first drive signal based on the third oscillation signal, when the first abnormality detection circuit detects an abnormality in which an output of the first oscillation signal is stopped, and the second control circuit may perform control to stop the output of the second drive signal based on the third oscillation signal, when the second abnormality detection circuit detects an abnormality in which an output of the second oscillation signal is stopped.

In one aspect of the drive circuit, the first drive signal output circuit may transmit a processing state of the first drive signal output circuit to the second drive signal output circuit, and the second drive signal output circuit may transmit a processing state of the second drive signal output circuit to the first drive signal output circuit.

According to another aspect of the present disclosure, there is provided a liquid ejecting apparatus including an aspect of the drive circuit, and a print head that includes the first piezoelectric element and the second piezoelectric element, and ejects a liquid by driving at least one of the first piezoelectric element and the second piezoelectric element.

DESCRIPTION OF EXEMPLARY EMBODIMENTS

Hereinafter, preferred embodiment of the present disclosure will be described with reference to the drawings. The drawings used are for convenience of description. The embodiment described below does not unduly limit the contents of the present disclosure described in the aspects. In addition, not all of the configurations described below are essential constituent requirements of the present disclosure.

1. Configuration of Liquid Ejecting Apparatus

A printing apparatus as an example of a liquid ejecting apparatus according to the present embodiment is an ink jet printer that forms dots on a print medium such as a paper by ejecting an ink in accordance with image data input from an external host computer, and prints an image including characters, graphics, and the like according to the image data.

Figure 1:
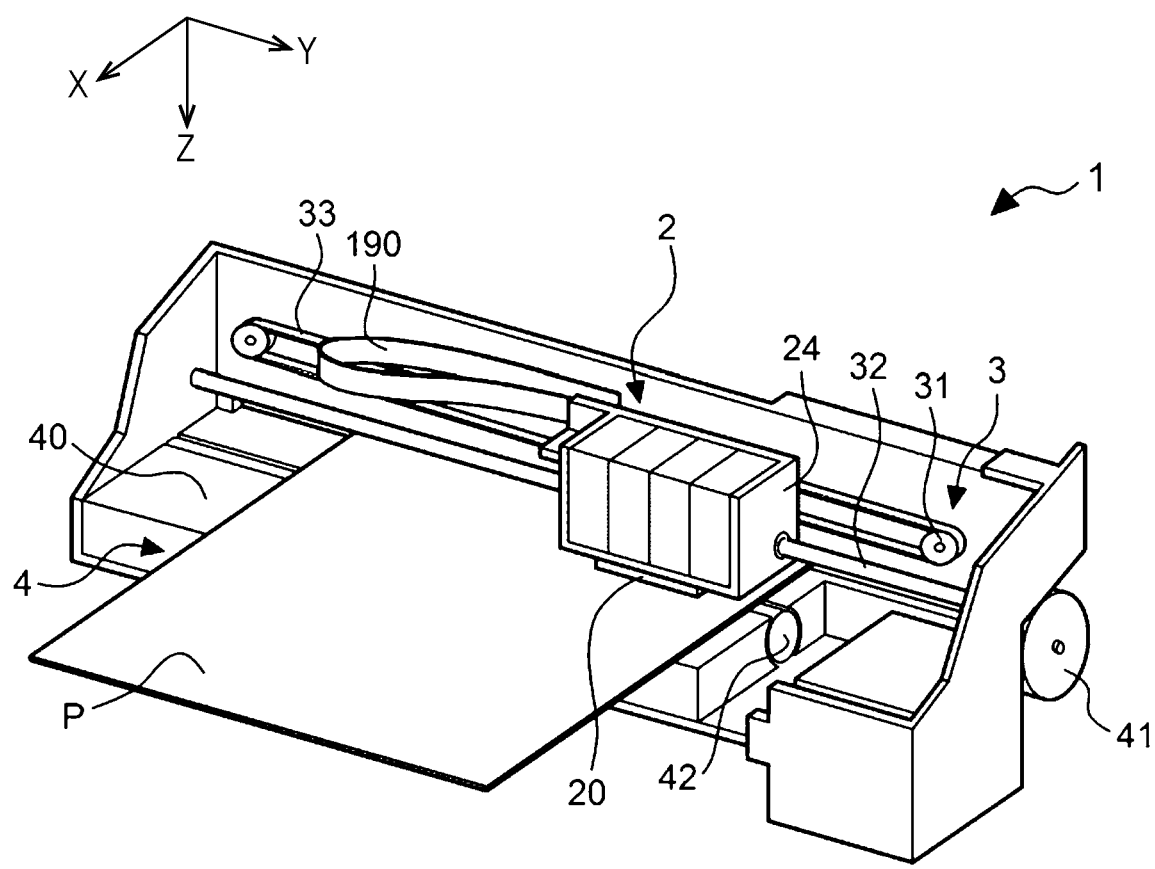
FIG. 1 is a perspective view illustrating a schematic configuration of a liquid ejecting apparatus.

FIG. 1 is a perspective view illustrating a schematic configuration of a liquid ejecting apparatus 1. FIG. 1 illustrates a direction X in which a medium P is transported, a direction Y in which a moving object 2 reciprocates across the direction X, and a direction Z in which an ink is ejected. In the present embodiment, the direction X, the direction Y, and the direction Z are described as axes orthogonal to each other, and the present disclosure is not limited to the various configurations of the liquid ejecting apparatus 1 being disposed orthogonal to each other. In addition, in the following description, the direction Y in which the moving object 2 moves may be referred to as a main scanning direction.

As illustrated in FIG. 1, the liquid ejecting apparatus 1 is provided with the moving object 2, and a moving mechanism 3 that reciprocates the moving object 2 along the direction Y. The moving mechanism 3 includes a carriage motor 31 that is a driving source of the moving object 2, a carriage guide shaft 32 that is fixed at both ends, and a timing belt 33 that extends substantially parallel to the carriage guide shaft 32 and is driven by the carriage motor 31.

A carriage 24 included in the moving object 2 is supported by the carriage guide shaft 32 so as to reciprocate freely, and is fixed to a portion of the timing belt 33. By driving the timing belt 33 by the carriage motor 31, the carriage 24 is guided by the carriage guide shaft 32 and reciprocates along the direction Y. In addition, a head unit 20 having a large number of nozzles is provided in a portion of the moving object 2 that faces the medium P. A control signal or the like is input to the head unit 20 through a cable 190. The head unit 20 ejects an ink as an example of liquid from the nozzle based on the input control signal.

The liquid ejecting apparatus 1 is provided with a transport mechanism 4 that transports the medium P on a platen 40 along the direction X. The transport mechanism 4 is provided with a transport motor 41 as a driving source, and a transport roller 42 that is rotated by the transport motor 41 and transports the medium P along the direction X.

In the liquid ejecting apparatus 1 configured as described above, an image is formed on a surface of the medium P by the head unit 20 ejecting the ink at a timing when the medium P is transported by the transport mechanism 4.

2. Electrical Configuration of Liquid Ejecting Apparatus

Figure 2:
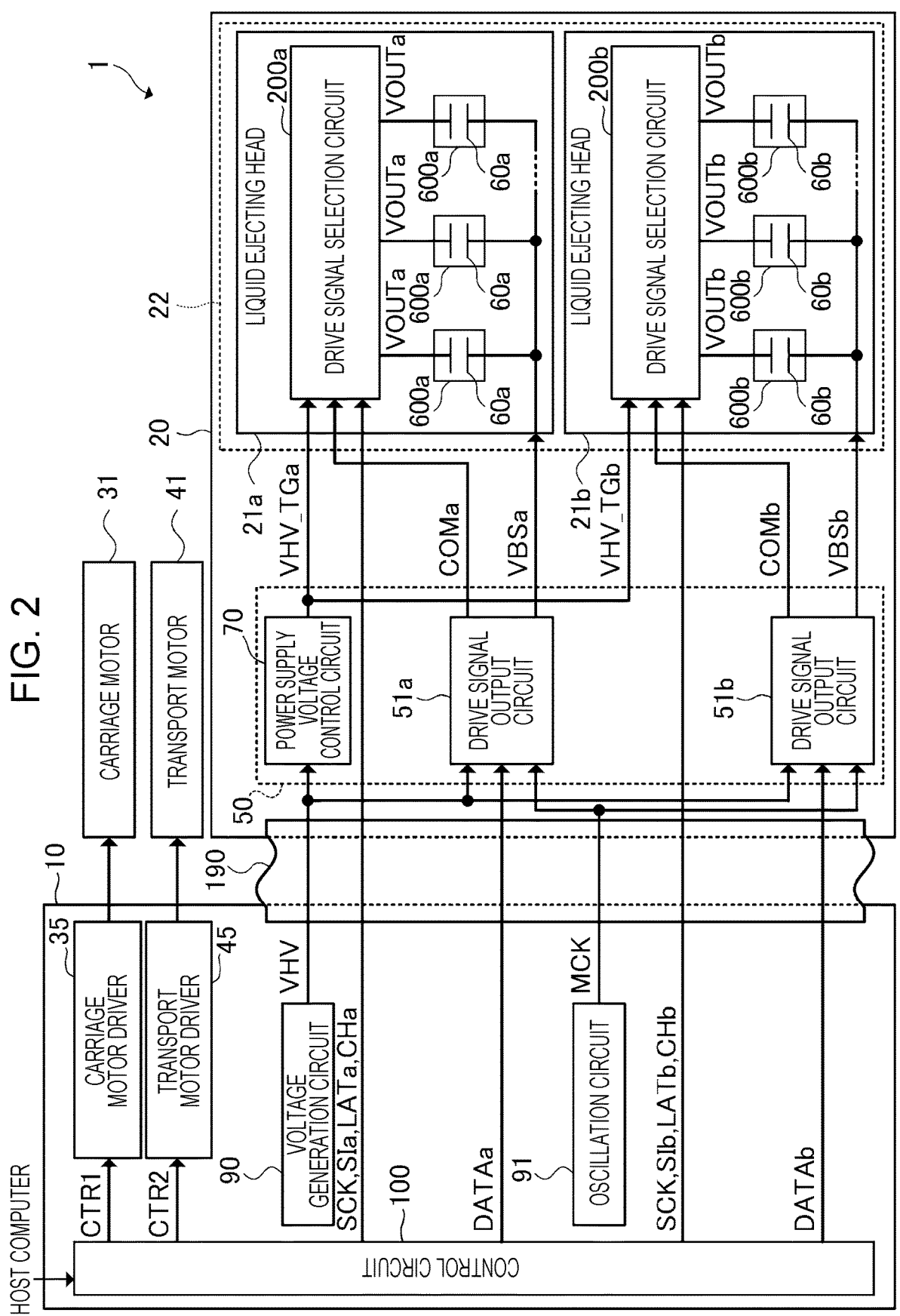
FIG. 2 is a block diagram illustrating an electrical configuration of the liquid ejecting apparatus.

FIG. 2 is a block diagram illustrating an electrical configuration of the liquid ejecting apparatus 1. As illustrated in FIG. 2, the liquid ejecting apparatus 1 includes a control unit 10 and the head unit 20. The control unit 10 and the head unit 20 are electrically coupled by the cable 190 such as a flexible flat cable (FFC).

The control unit 10 is provided with a control circuit 100, a carriage motor driver 35, a transport motor driver 45, a voltage generation circuit 90, and an oscillation circuit 91. The control circuit 100 generates a plurality of control signals and the like for controlling various configurations based on the image data input from the host computer, and outputs the control signals to the head unit 20.

Specifically, the control circuit 100 supplies a control signal CTR1 to the carriage motor driver 35. The carriage motor driver 35 drives the carriage motor 31 according to the control signal CTR1. As a result, the movement of the carriage 24 in the direction Y of the carriage 24 illustrated in FIG. 1 is controlled. In addition, the control circuit 100 supplies a control signal CTR2 to the transport motor driver 45. The transport motor driver 45 drives the transport motor 41 in accordance with the control signal CTR2. As a result, the movement of the medium P in the direction X illustrated in FIG. 1 is controlled.

In addition, the control circuit 100 $o$ outputs a clock signal SCK, print data signals SIa and SIb, latch signals LATa and LATb, change signals CHa and CHb, and drive data signals DATAa and DATAb to the head unit 20.

The voltage generation circuit 90 generates a voltage VHV of, for example, DC42V. The voltage generation circuit 90 supplies the voltage VHV to the various configurations included in the control unit 10, and the head unit 20.

The oscillation circuit 91 outputs a clock signal MCK. The clock signal MCK output from the oscillation circuit 91 is input to the head unit 20. Here, the oscillation circuit 91 is an example of a third oscillation circuit, and the clock signal MCK output from the oscillation circuit 91 is an example of a third oscillation signal. The oscillation circuit 91 may be configured independently of the control circuit 100 as illustrated in FIG. 2 or may be configured inside the control circuit 100.

The head unit 20 is provided with a print head 22 and a drive circuit 50.

The drive circuit 50 includes drive signal output circuits 51a and 51b and a power supply voltage control circuit 70. The drive circuit 50 drives a liquid ejecting head 21a and a liquid ejecting head 21b.

A voltage VHV is input to the power supply voltage control circuit 70. The power supply voltage control circuit 70 outputs a voltage VHV_TGa to the liquid ejecting head 21a and outputs a voltage VHV_TGb to the liquid ejecting head 21b. The power supply voltage control circuit 70 controls the supply of the voltage VHV to the liquid ejecting head 21a and the liquid ejecting head 21b included in the print head 22.

The drive signal output circuit 51a receives the voltage VHV, the drive data signal DATAa, and the clock signal MCK. The drive signal output circuit 51a generates a drive signal COMa and a reference voltage signal VBSa based on the input voltage VHV, the drive data signal DATAa, and the clock signal MCK, and outputs the drive signal COMa and the reference voltage signal VBSa to the liquid ejecting head 21a. Here, the reference voltage signal VBSa is a signal having a constant voltage, for example, a signal having a voltage such as a ground potential, DC 5V, or DC 6V.

In addition, the voltage VHV, a drive data signal DATAb, and the clock signal MCK are input to the drive signal output circuit 51b. The drive signal output circuit 51b generates a drive signal COMb and a reference voltage signal VBSb based on the input voltage VHV, the drive data signal DATAb, and the clock signal MCK, and outputs a drive signal COMb and a reference voltage signal VBSb to the liquid ejecting head 21b. Here, the reference voltage signal VBSb is a signal having a constant voltage, for example, a signal having a voltage such as a ground potential, DC 5V, or DC 6V. Details of the configuration and operation of the drive circuit 50 will be described later.

The print head 22 includes a liquid ejecting head 21a and a liquid ejecting head 21b. The print head 22 includes a piezoelectric element 60a and a piezoelectric element 60b, and ejects the ink when at least one of the piezoelectric element 60a and the piezoelectric element 60b is driven.

The liquid ejecting head 21a includes a drive signal selection circuit 200a and a plurality of ejection units 600a. In addition, each of the ejection units 600a includes the piezoelectric element 60a. A clock signal SCK, a print data signal SIa, a latch signal LATa, a change signal CHa, a drive signal COMa, and a voltage VHV_TGa are input to the drive signal selection circuit 200a. The drive signal selection circuit 200a generates a drive signal VOUTa by selecting or deselecting the drive signal COMa based on the clock signal SCK, the print data signal SIa, the latch signal LATa, the change signal CHa, and the voltage VHV_TGa.

The drive signal VOUTa is supplied to one end of the piezoelectric element 60a included in each of the plurality of ejection units 600a. In addition, the reference voltage signal VBSa is supplied to the other end of the piezoelectric element 60a. When the piezoelectric element 60a is driven by a potential difference between the drive signal VOUTa and the reference voltage signal VBSa, the ink is ejected from the ejection unit 600a. That is, the liquid ejecting head 21a includes the piezoelectric element 60a that is driven by the drive signal COMa and the drive signal selection circuit 200a that controls the supply of the drive signal COMa to the piezoelectric element 60a.

The liquid ejecting head 21b includes a drive signal selection circuit 200b and a plurality of ejection units 600b. In addition, each of the ejection units 600b includes the piezoelectric element 60b. A clock signal SCK, a print data signal SIb, a latch signal LATb, a change signal CHb, a drive signal COMb, and a voltage VHV_TGb are input to the drive signal selection circuit 200b. The drive signal selection circuit 200b generates a drive signal VOUTb by selecting or deselecting the drive signal COMb based on the clock signal SCK, the print data signal SIb, the latch signal LATb, the change signal CHb, and the voltage VHV_TGb.

The drive signal VOUTb is supplied to one end of the piezoelectric element 60b included in each of the plurality of ejection units 600b. In addition, the reference voltage signal VBSb is supplied to the other end of the piezoelectric element 60b. When the piezoelectric element 60b is driven by a potential difference between the drive signal VOUTb and the reference voltage signal VBSb, the ink is ejected from the ejection unit 600b. That is, the liquid ejecting head 21b includes the piezoelectric element 60b that is driven by the drive signal COMb, and the drive signal selection circuit 200b that controls the supply of the drive signal COMb to the piezoelectric element 60b.

Here, the piezoelectric element 60a included in the liquid ejecting head 21a is an example of a first piezoelectric element, and the drive signal COMa for driving the piezoelectric element 60a and the drive signal VOUTa generated by selecting or deselecting the drive signal COMa are examples of first drive signals. Similarly, the piezoelectric element 60b included in the liquid ejecting head 21b is an example of a second piezoelectric element, and the drive signal COMb for driving the piezoelectric element 60b and the drive signal VOUTb generated by selecting or deselecting the drive signal COMb are examples of second drive signals. The drive signal output circuit 51a that outputs the drive signal COMa is an example of a first drive signal output circuit. Similarly, the drive signal output circuit 51b that outputs the drive signal COMb is an example of a second drive signal output circuit.

In the following description, the drive signal output circuits 51a and 51b have the same configuration, and may be referred to as the drive signal output circuit 51 when it is not necessary to distinguish between these. Various signals input to the drive signal output circuit 51 are referred to as voltages VHV, VHV_TG, a drive data signal DATA, and a clock signal MCK. In addition, various signals output from the drive signal output circuit 51 are referred to as a drive signal COM and a reference voltage signal VBS.

In addition, the liquid ejecting heads 21a and 21b have the same configuration, and are referred to as the liquid ejecting head 21 when it is not necessary to distinguish between these. In addition, the liquid ejecting head 21 has a drive signal selection circuit 200 and the plurality of ejection units 600, and the plurality of ejection units 600 is described as including the piezoelectric elements 60. In this case, various signals input to the liquid ejecting head 21 are referred to as a clock signal SCK, a print data signal SI, a latch signal LAT, a change signal CH, a drive signal COM, a reference voltage signal VBS, and a voltage VHV_TG. In addition, a signal supplied to the piezoelectric element 60 is referred to as a drive signal VOUT.

3. Configuration and Operation of Liquid Ejecting Head

Next, a configuration and operation of the drive signal selection circuit 200 will be described. In describing the configuration and operation of the drive signal selection circuit 200, first, an example of the drive signal COM input to the drive signal selection circuit 200 will be described with reference to FIG. 3. Thereafter, the configuration and operation of the drive signal selection circuit 200 will be described with reference to FIGS. 4 to 7.

Figure 3:
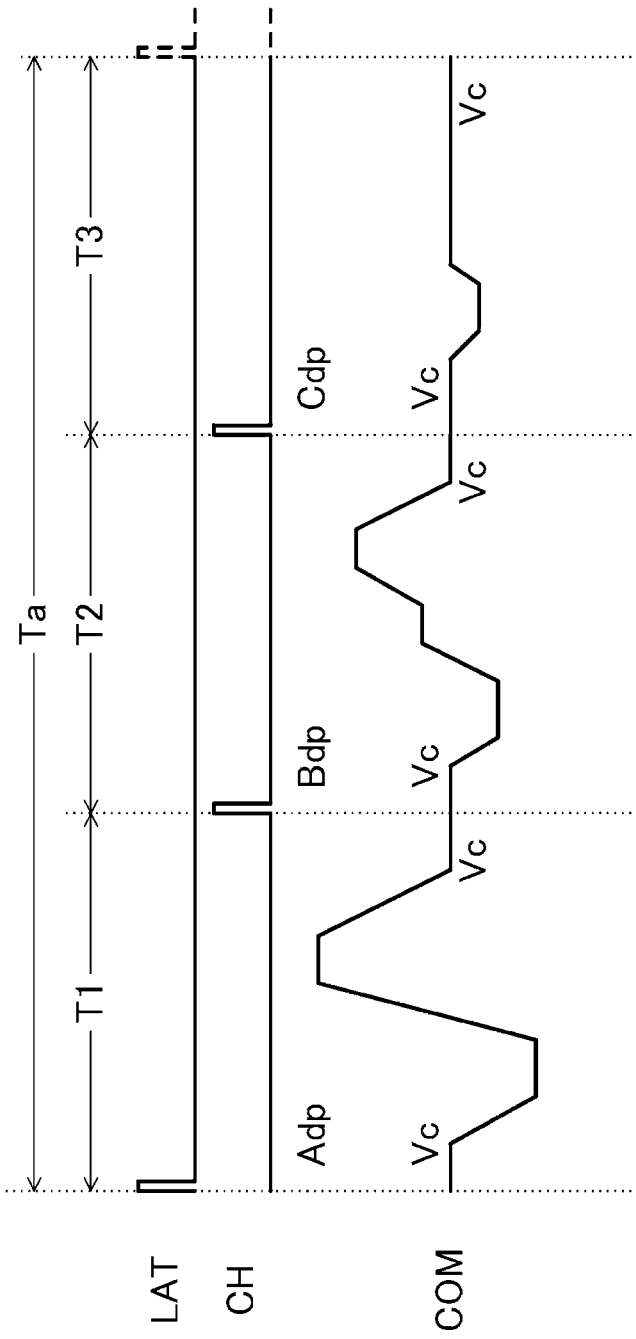
FIG. 3 is a graph illustrating an example of a drive signal COM.

FIG. 3 is a graph illustrating an example of the drive signal COM. FIG. 3 illustrates a period T1 from when the latch signal LAT rises to when the change signal CH rises, a period T2 until the next change signal CH rises after the period T1, and a period T3 until the latch signal LAT rises after the period T2. A cycle formed of the periods T1, T2, and T3 is a cycle Ta for forming a new dot on the medium P. That is, as illustrated in FIG. 3, the latch signal LAT is a signal that defines a cycle in which a new dot is formed on the medium P, and the change signal CH a signal that defines a switching timing of a waveform included in the drive signal COM.

As illustrated in FIG. 3, the drive signal output circuit 51 generates a trapezoidal waveform Adp in the period T1. When the trapezoidal waveform Adp is supplied to the piezoelectric element 60, a predetermined amount, specifically, a medium amount of ink is ejected from the corresponding ejection unit 600. In addition, the drive signal output circuit 51 generates a trapezoidal waveform Bdp in the period T2. When the trapezoidal waveform Bdp is supplied to the piezoelectric element 60, a small amount of ink smaller than the predetermined amount is ejected from the corresponding ejection unit 600. In addition, the drive signal output circuit 51 generates a trapezoidal waveform Cdp in the period T3. When the trapezoidal waveform Cdp is supplied to the piezoelectric element 60, the piezoelectric element 60 is driven to the extent that the ink is not ejected from the corresponding ejection unit 600. Therefore, when the trapezoidal waveform Cdp is supplied to the piezoelectric element 60, no dot is formed on the medium P. This trapezoidal waveform Cdp is a waveform for preventing a viscosity of the ink from increasing by causing the ink in a vicinity of a nozzle opening portion of the ejection unit 600 to vibrate slightly. In the following description, driving the piezoelectric element 60 to such an extent that ink is not ejected from the ejection unit 600 in order to prevent the viscosity of the ink from increasing is referred to as "slight vibration".

Here, a voltage value at the start timing and a voltage value at the end timing of the trapezoidal waveform Adp, the trapezoidal waveform Bdp, and the trapezoidal waveform Cdp are all common to a voltage Vc. That is, the trapezoidal waveforms Adp, Bdp, and Cdp are waveforms that start with the voltage Vc and end with the voltage Vc. Therefore, the drive signal output circuit 51 outputs the drive signal COM having a waveform in which the trapezoidal waveforms Adp, Bdp, and Cdp are continuous in the cycle Ta. The waveform of the drive signal COM illustrated in FIG. 3 is an example, and the waveform of the drive signal COM may be a different waveform. In addition, the drive signal output circuit 51a and the drive signal output circuit 51b may generate and output a drive signal COM having a different waveform.

Figure 4:
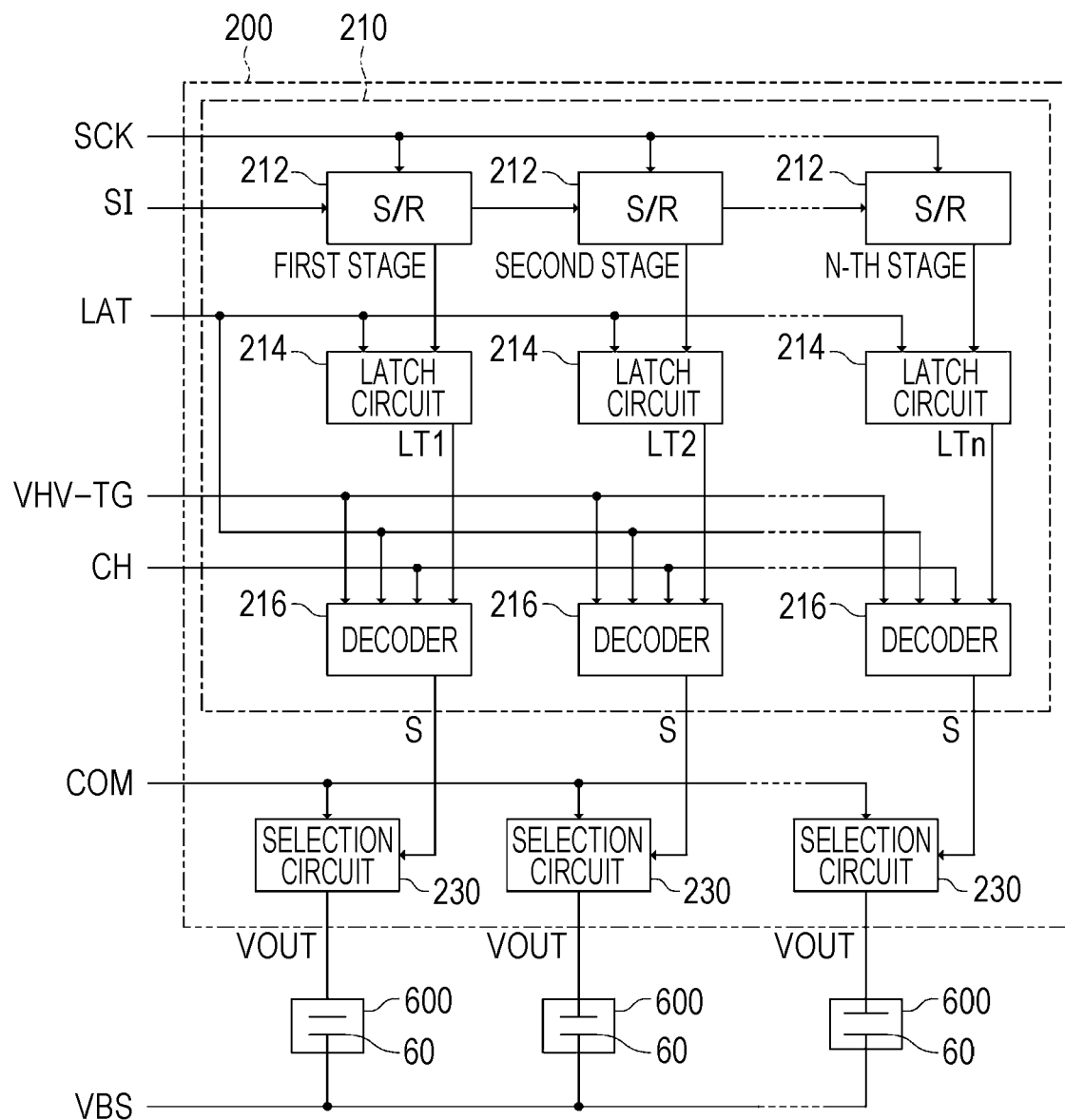
FIG. 4 is a block diagram illustrating an electrical configuration of a drive signal selection circuit.

FIG. 4 is a block diagram illustrating an electrical configuration of the drive signal selection circuit 200. The drive signal selection circuit 200 generates and outputs the drive signal VOUT supplied to the piezoelectric element 60 in the cycle Ta by switching whether or not to select the trapezoidal waveforms Adp, Bdp, and Cdp included in the drive signal COM in each of the periods T1, T2, T3. As illustrated in FIG. 4, the drive signal selection circuit 200 includes a selection control circuit 210 and a plurality of selection circuits 230.

The selection control circuit 210 is supplied with a clock signal SCK, a print data signal SI, a latch signal LAT, a change signal CH, and a voltage VHV_TG. In the selection control circuit 210, a set of a shift register 212 (S/R), a latch circuit 214, and a decoder 216 is provided corresponding to each of the ejection units 600. That is, the head unit 20 is provided with the set of shift registers 212, latch circuits 214, and decoders 216 as many as the total number n of the ejection units 600.

The shift register 212 temporarily holds 2-bit print data [SIH, SIL] included in the print data signal SI for each corresponding ejection unit 600. Specifically, the shift register 212 having the number of stages corresponding to the ejection unit 600 are coupled to each other in cascade, and the serially supplied print data signal SI is sequentially transferred to the subsequent stage according to the clock signal SCK. In FIG. 4, in order to distinguish the shift register 212, a first stage, a second stage, . . . , and a n-th stage are indicated in order from the upstream to which the print data signal SI is supplied.

Each of the n latch circuits 214 latches the print data [SIH, SIL] held in the corresponding shift register 212 at the rising edge of the latch signal LAT. Each of the n decoders 216 decodes the 2-bit print data [SIH, SIL] latched by the corresponding latch circuit 214 to generate a selection signal S and supplies the selection signal S to the selection circuit 230.

The selection circuit 230 is provided corresponding to each of the ejection units 600. That is, the number of selection circuits 230 included in one head unit 20 is the same as the total number n of ejection units 600 included in the head unit 20. The selection circuit 230 controls the supply of the drive signal COM to the piezoelectric element 60 based on the selection signal S supplied from the decoder 216.

Figures 5, 6:
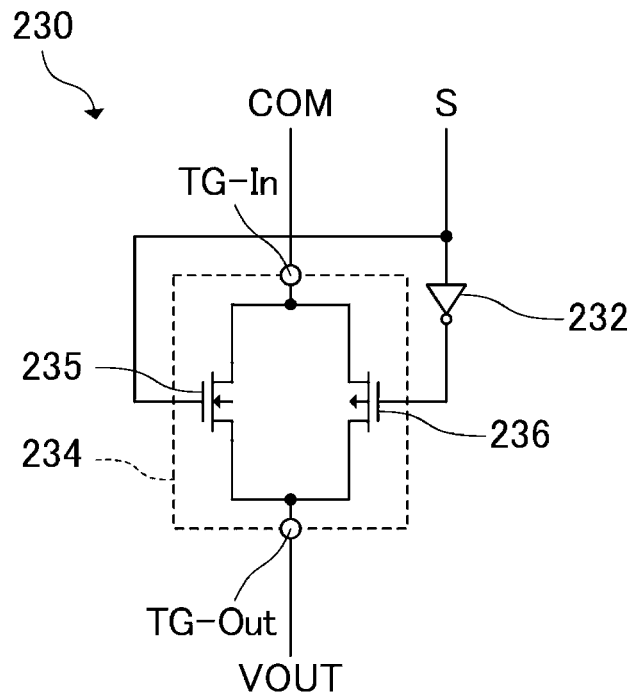
FIG. 5 is a circuit diagram illustrating an electrical configuration of a selection circuit.
FIG. 6 is a table illustrating decoding contents in a decoder.

FIG. 5 is a circuit diagram illustrating an electrical configuration of the selection circuit 230 corresponding to one ejection unit 600. As illustrated in FIG. 5, the selection circuit 230 includes an inverter 232 and a transfer gate 234. In addition, the transfer gate 234 includes a transistor 235 that is an NMOS transistor and a transistor 236 that is a PMOS transistor.

The selection signal S is supplied from the decoder 216 to a gate terminal of the transistor 235. In addition, the selection signal S is logically inverted by the inverter 232 and is also supplied to the gate terminal of the transistor 236. A drain terminal of the transistor 235 and a source terminal of the transistor 236 are coupled to a terminal TG-In which is one end. The drive signal COM is input from the terminal TG-In. The transistor 235 and the transistor 236 are controlled to be turned on or off according to the selection signal S, and thus the drive signal VOUT is output from a terminal TG-Out which is the other end to which the source terminal of the transistor 235 and the drain terminal of the transistor 236 are coupled commonly. The terminal TG-Out is electrically coupled to an electrode 611 described later of the piezoelectric element 60. In the following description, the case where the transistor 235 and the transistor 236 are controlled to be conductive may be referred to as "on", and the case where the transistor 235 and the transistor 236 are controlled to be non-conductive may be referred to as "off".

Next, the decoding contents of the decoder 216 will be described with reference to FIG. 6. FIG. 6 is a table illustrating decoding contents in the decoder 216. The 2-bit print data [SIH, SIL], the latch signal LAT, and the change signal CH are input to the decoder 216. For example, when the print data [SIH, SIL] is [1, 0] that defines "medium dot", the decoder 216 outputs a selection signal S that is H, L, and L level in the periods T1, T2, and T3. Here, the logic level of the selection signal S is level-shifted to a high amplitude logic based on the voltage VHV_TG by a level shifter (not illustrated).

Figure 7:
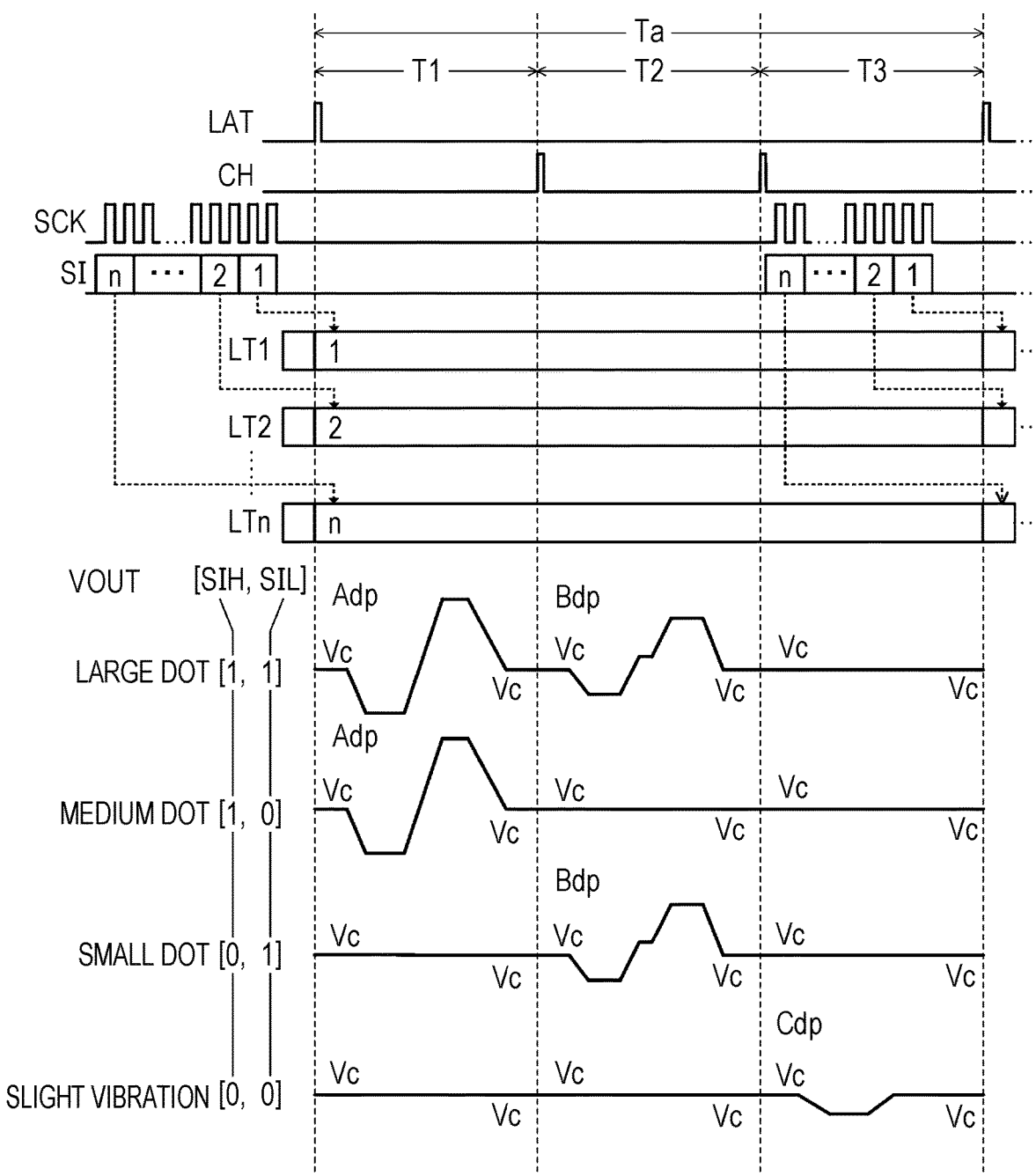
FIG. 7 is a graph for describing an operation of the drive signal selection circuit.

FIG. 7 is a graph for describing an operation of the drive signal selection circuit 200. As illustrated in FIG. 7, the print data signal SI is serially supplied to the drive signal selection circuit 200 in synchronization with the clock signal SCK, and sequentially transferred in the shift register 212 corresponding to the ejection unit 600. When the supply of the clock signal SCK is stopped, the print data [SIH, SIL] corresponding to the ejection unit 600 is held in each of the shift registers 212. The print data signal SI is supplied in order corresponding to a final n stage, . . . , a second stage, and a first stage ejection units 600 in the shift register 212.

Here, when the latch signal LAT rises, each of the latch circuits 214 latches simultaneously the print data [SIH, SIL] held in the corresponding shift register 212. LT1, LT2, . . . , LTn illustrated in FIG. 7 are the print data [SIH, SIL] latched by the latch circuit 214 corresponding to a first stage, a second stage, . . . , and a n-th stage shift register 212.

The decoder 216 outputs a logic level selection signal S according to the contents illustrated in FIG. 6 in each of the periods T1, T2, and T3 in accordance with the dot size defined by the latched print data [SIH, SIL].

When the print data [SIH, SIL] is [1, 1], the selection circuit 230 selects the trapezoidal waveform Adp in the period T1, the trapezoidal waveform Bdp in the period T2, and does not select the trapezoidal waveform Cdp in the period T3, according to the selection signal S. As a result, the drive signal VOUT corresponding to the large dot illustrated in FIG. 7 is generated. Therefore, a medium amount of ink and a small amount of ink are ejected from the ejection unit 600. Therefore, the large dots are formed on the medium P by combining the ink. In addition, when the print data [SIH, SIL] is [1, 0], the selection circuit 230 selects the trapezoidal waveform Adp in the period T1, does not select the trapezoidal waveform Bdp in the period T2, and does not select the trapezoidal waveform Cdp in the period T3, according to the selection signal S. As a result, the drive signal VOUT corresponding to the medium dot illustrated in FIG. 7 is generated. Therefore, a medium amount of ink is ejected from the ejection unit 600. Therefore, the medium dots are formed on the medium P. In addition, when the print data [SIH, SIL] is [0, 1], the selection circuit 230 does not select the trapezoidal waveform Adp in the period T1, selects the trapezoidal waveform Bdp in the period T2, and does not select the trapezoid waveform Cdp in the period T3, according to the selection signal S. As a result, the drive signal VOUT corresponding to the small dot illustrated in FIG. 7 is generated. Therefore, a small amount of ink is ejected from the ejection unit 600. Therefore, the small dots are formed on the medium P. In addition, when the print data [SIH, SIL] is [0, 0], the selection circuit 230 does not select the trapezoidal waveform Adp in the period T1, does not select the trapezoidal waveform Bdp in the period T2, and selects the trapezoidal waveform Cdp in the period T3, according to the selection signal S. As a result, the drive signal VOUT corresponding to the slight vibration illustrated in FIG. 7 is generated. Therefore, the ink is not ejected from the ejection unit 600, and slight vibrations occur.

That is, the drive signal VOUTa is generated by selecting the trapezoidal waveform included in the drive signal COMa output from the drive signal output circuit 51a. Therefore, the drive signal COMa and the drive signal VOUTa are both signals for driving the piezoelectric element 60a, and are also signals output from the drive signal output circuit 51a. Similarly, the drive signal VOUTb is generated by selecting the trapezoidal waveform included in the drive signal COMb output from the drive signal output circuit 51b. Therefore, the drive signal COMb and the drive signal VOUTb are both signals for driving the piezoelectric element 60b, and are also signals output from the drive signal output circuit 51b.

Figure 8:
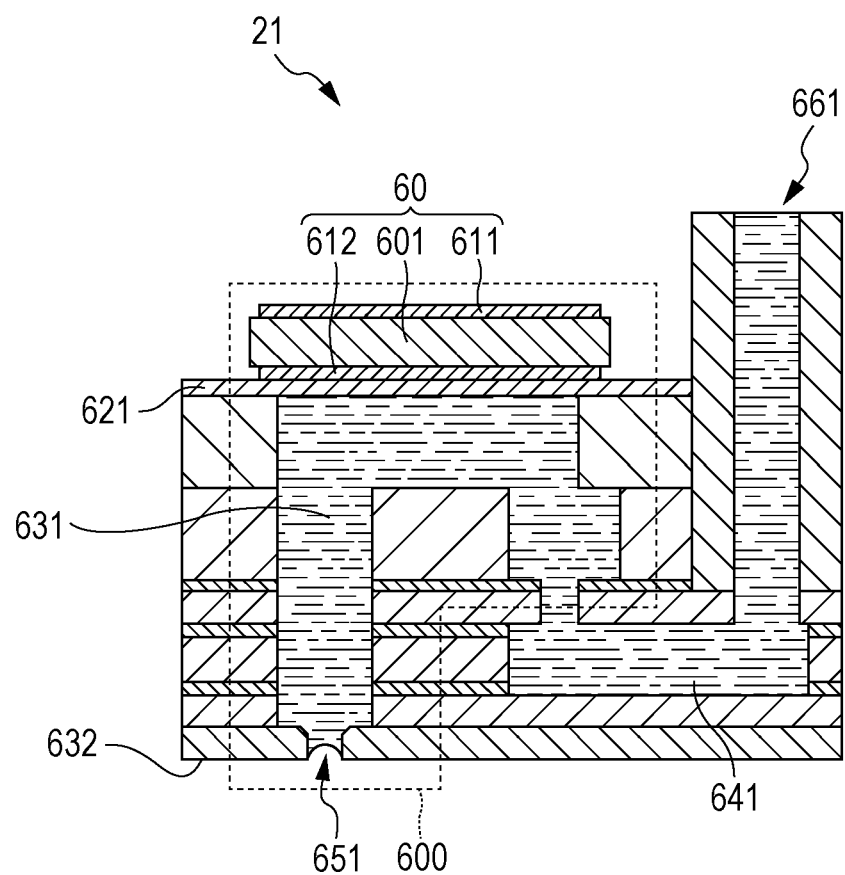
FIG. 8 is a cross-sectional view illustrating a schematic configuration of an ejection unit.

Here, the configuration and operation of the ejection unit 600 including the piezoelectric element 60 will be described with reference to FIG. 8. FIG. 8 is a cross-sectional view illustrating a schematic configuration of the ejection unit 600 when the liquid ejecting head 21 is cut so as to include the ejection unit 600.

As illustrated in FIG. 8, the liquid ejecting head 21 includes the ejection unit 600 and a reservoir 641. The ink is introduced into the reservoir 641 from a supply port 661. In addition, the reservoir 641 is provided for each ink color.

The ejection unit 600 includes the piezoelectric element 60, a diaphragm 621, a cavity 631, and a nozzle 651. The diaphragm 621 is provided between the cavity 631 and the piezoelectric element 60. The diaphragm 621 is displaced when the piezoelectric element 60 provided on the upper surface is driven. That is, the diaphragm 621 functions as a diaphragm that expands and reduces an internal volume of the cavity 631 by being displaced. The cavity 631 is filled with the ink. In addition, the cavity 631 functions as a pressure chamber whose internal volume changes by driving the piezoelectric element 60. The nozzle 651 is an opening portion provided in the nozzle plate 632 and communicating with the cavity 631.

The piezoelectric element 60 has a structure in which a piezoelectric body 601 is interposed between a pair of electrodes 611 and 612.

The drive signal VOUT is supplied to the electrode 611, and the reference voltage signal VBS is supplied to an electrode 612. The piezoelectric element 60 having such a structure is driven according to the potential difference between the electrode 611 and the electrode 612. As the piezoelectric element 60 is driven, the central portions of the electrodes 611 and 612 and the diaphragm 621 are displaced in a vertical direction with respect to both end portions. As the diaphragm 621 is displaced, the internal volume of the cavity 631 changes, and the ink filled in the cavity 631 is ejected from the nozzle 651.

4. Configuration and Operation of Drive Circuit

Figure 9:
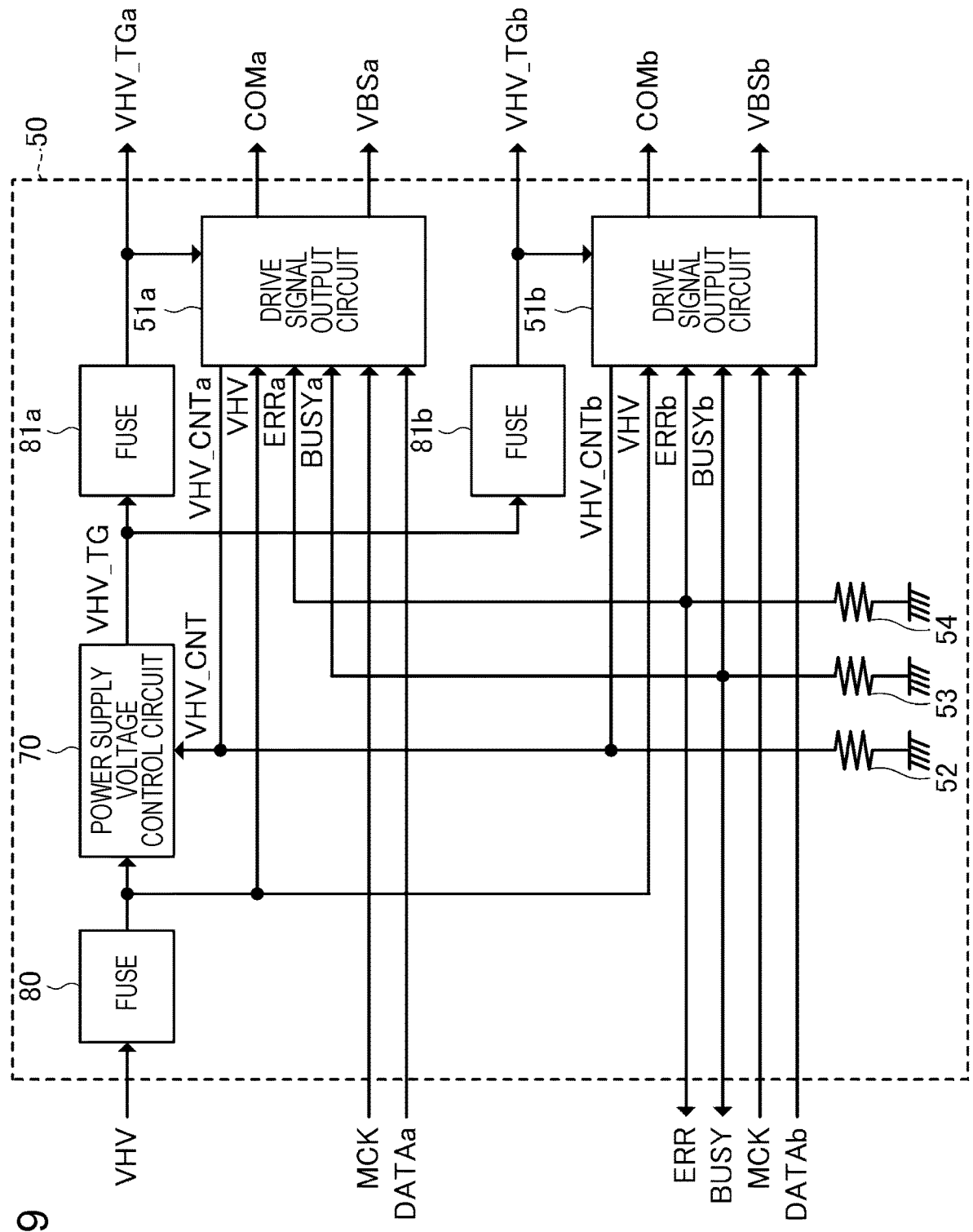
FIG. 9 is a block diagram illustrating a configuration of a drive circuit.

Next, a configuration and operation of the drive circuit 50 will be described. FIG. 9 is a block diagram illustrating a configuration of the drive circuit 50. As illustrated in FIG. 9, the drive circuit 50 includes a power supply voltage control circuit 70, drive signal output circuits 51a and 51b, and fuses 80, 81a, and 81b.

The fuse 80 has one end that receives the voltage VHV from the voltage generation circuit 90 and the other end electrically coupled to the power supply voltage control circuit 70. In addition, the fuse 81a has one end electrically coupled to the drive signal output circuit 51a and the drive signal selection circuit 200a, and the other end electrically coupled to the power supply voltage control circuit 70. In addition, the fuse 81b has one end electrically coupled to the drive signal output circuit 51b and the drive signal selection circuit 200b, and the other end electrically coupled to the power supply voltage control circuit 70. In the fuses 80, 81a, and 81b provided in the drive circuit 50 configured as described above, a rated current of the fuse 80 is preferably larger than rated currents of the fuses 81a and 81b.

The voltage VHV is input to the power supply voltage control circuit 70 through the fuse 80. The power supply voltage control circuit 70 outputs the voltage VHV_TG to the liquid ejecting heads 21a and 21b.

Specifically, the power supply voltage control circuit 70 switches whether or not to output the voltage VHV as the voltage VHV_TG based on the logic level of an input VHV control signal VHV_CNT. Specifically, the power supply voltage control circuit 70 includes a switch circuit having one or a plurality of switching elements. When the input VHV control signal VHV_CNT is at the H level, the power supply voltage control circuit 70 controls the switch circuit so that the potential of the voltage VHV_TG is the potential of the voltage VHV. In addition, when the input VHV control signal VHV_CNT is at L level, the power supply voltage control circuit 70 controls the switch circuit so that the potential of the voltage VHV_TG is the ground potential.

The voltage VHV_TG output from the power supply voltage control circuit 70 is input to the liquid ejecting head 21a as the voltage VHV_TGa through the fuse 81a. In addition, the voltage VHV_TG is input to the liquid ejecting head 21b as the voltage VHV_TGb through the fuse 81b. That is, the power supply voltage control circuit 70 controls the supply of the voltage VHV to the liquid ejecting head 21a and the liquid ejecting head 21b. In the following description, although it is described that the power supply voltage control circuit 70 outputs the voltage VHV_TG having the potential of the voltage VHV when the VHV control signal VHV_CNT is at the H level, and outputs the voltage VHV_TG having the ground potential when the VHV control signal VHV_CNT is at the L level, the relationship between the VHV control signal VHV_CNT and the potential of the voltage VHV_TG is not limited thereto.

Figure 10:
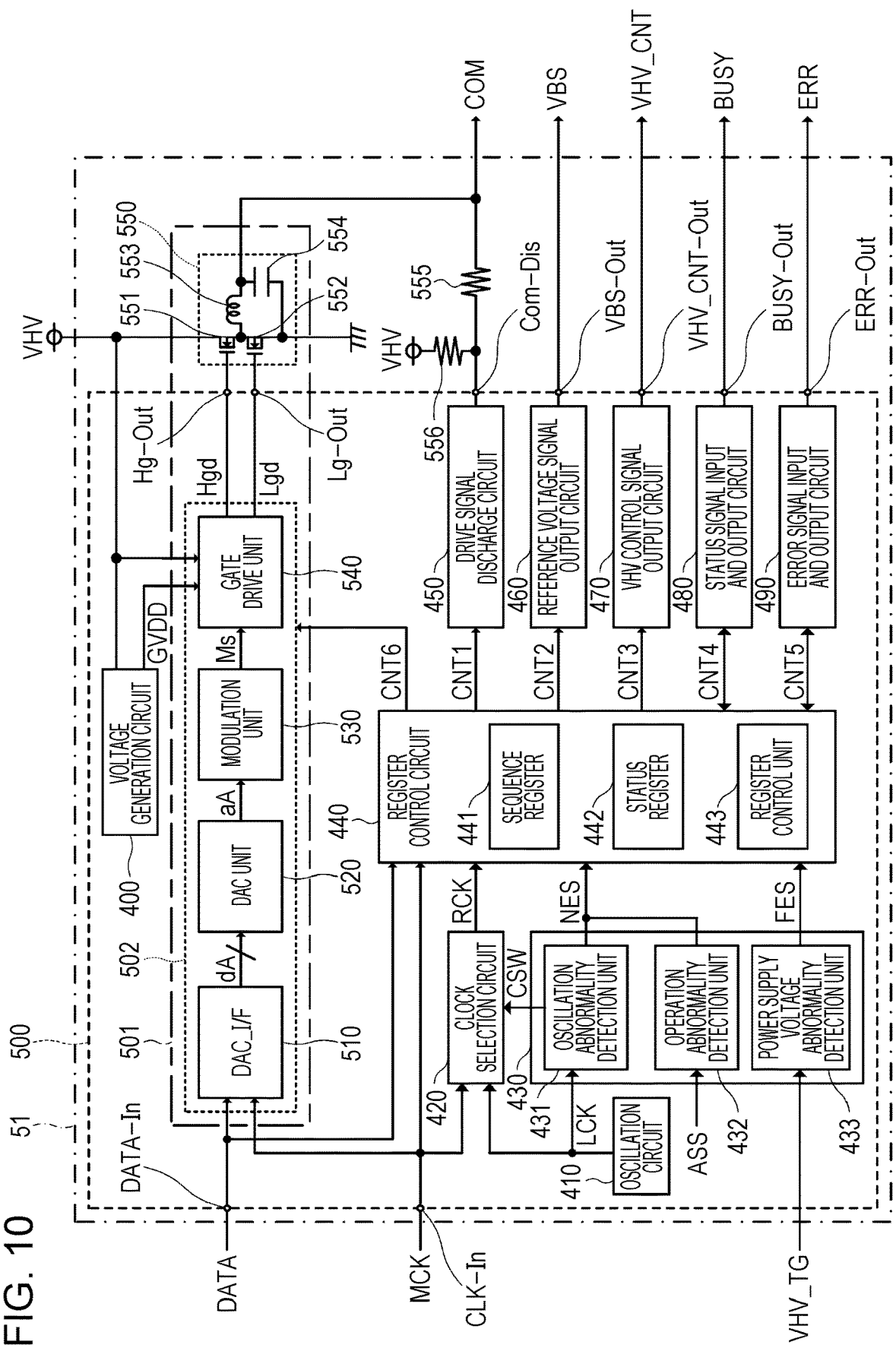
FIG. 10 is a block diagram illustrating a configuration of a drive signal output circuit.

The drive signal output circuit 51a is electrically coupled to the fuse 80 and the power supply voltage control circuit 70. In addition, the drive signal output circuit 51b is electrically coupled to the fuse 80 and the power supply voltage control circuit 70. Here, the configuration of the drive signal output circuits 51a and 51b will be described with reference to FIG. 10. In FIG. 10, the drive signal output circuits 51a and 51b are described as the drive signal output circuit 51 without distinguishing these. FIG. 10 is a block diagram illustrating a configuration of the drive signal output circuit 51. The drive signal output circuit 51 includes an integrated circuit 500, a drive signal amplifier circuit 550, and resistors 555 and 556.

The integrated circuit 500 includes an amplification control signal generation circuit 502, a voltage generation circuit 400, an oscillation circuit 410, a clock selection circuit 420, an abnormality detection circuit 430, a register control circuit 440, a drive signal discharge circuit 450, a reference voltage signal output circuit 460, and a VHV control signal output circuit 470, a status signal input and output circuit 480, and an error signal input and output circuit 490.

The voltage generation circuit 400 generates a voltage GVDD based on the voltage VHV. The voltage GVDD is a DC voltage signal of, for example, 7.5 V, and is input to various configurations of the integrated circuit 500 including a gate drive unit 540 described later.

The amplification control signal generation circuit 502 generates amplification control signals Hgd and Lgd based on a data signal that defines the waveform of the drive signal COM included in the drive data signal DATA input from a terminal DATA-In. The amplification control signal generation circuit 502 includes a digital to analog converter interface (DAC interface: DAC_I/F) 510, a DAC unit 520, a modulation unit 530, and a gate drive unit 540.

The DAC interface 510 receives the drive data signal DATA supplied from the terminal DATA-In and the clock signal MCK supplied from a terminal MCK-In. The DAC interface 510 integrates the drive data signal DATA based on the clock signal MCK, and generates, for example, 10-bit drive data dA that defines the waveform of the drive signal COM. The drive data dA is input to the DAC unit 520. The DAC unit 520 converts the input drive data dA into an analog signal base drive signal aA. The base drive signal aA is a target signal before amplification of the drive signal COM. The base drive signal aA is input to the modulation unit 530. The modulation unit 530 outputs a modulation signal Ms obtained by performing pulse width modulation on the base drive signal aA. The gate drive unit 540 receives the voltages VHV and GVDD and the modulation signal Ms. The gate drive unit 540 amplifies the input modulation signal Ms based on the voltage GVDD, inverts the logic level of an amplification control signal Hgd level-shifted to high amplitude logic based on the voltage VHV and the input modulation signal Ms, and generates an amplification control signal Lgd amplified based on the voltage GVDD. That is, the amplification control signal Hgd and the amplification control signal Lgd are mutually exclusive at the H level. The amplification control signal Hgd is output from the integrated circuit 500 through a terminal Hg-Out and input to the drive signal amplifier circuit 550. Similarly, the amplification control signal Lgd is output from the integrated circuit 500 through a terminal Lg-Out and input to the drive signal amplifier circuit 550.

The drive signal amplifier circuit 550 outputs the drive signal COM by operating based on the amplification control signals Hgd and Lgd. The drive signal amplifier circuit 550 includes transistors 551 and 552, a coil 553, and a capacitor 554. Each of the transistors 551 and 552 is, for example, an N-channel field effect transistor (FET).

The voltage VHV is supplied to a drain terminal of the transistor 551. The amplification control signal Hgd is supplied to a gate terminal of the transistor 551 through the terminal Hg-Out. A source terminal of the transistor 551 is electrically coupled to a drain terminal of the transistor 552. In addition, the amplification control signal Lgd is supplied to a gate terminal of the transistor 552 through the terminal Lg-Out. A source electrode of the transistor 552 is coupled to the ground. The transistor 551 coupled as described above operates according to the amplification control signal Hgd, and the transistor 552 operates according to the amplification control signal Lgd. That is, the transistor 551 and the transistor 552 are exclusively turned on. As a result, an amplified modulation signal obtained by amplifying the modulated signal Ms based on the voltage VHV is generated at the connection point between the source terminal of the transistor 551 and the drain terminal of the transistor 552. That is, the transistor 551 and the transistor 552 function as an amplifier circuit that amplifies a signal that is a source of the drive signal.

One of the coil 553 is coupled commonly to the source terminal of the transistor 551 and the drain terminal of the transistor 552. In addition, the other end of the coil 553 is coupled to one end of the capacitor 554. The other end of the capacitor 554 is coupled to the ground. That is, the coil 553 and the capacitor 554 constitute a low-pass filter. By supplying the amplified modulation signal to the low-pass filter, the amplified modulation signal is demodulated, and the drive signal COM is generated. The drive signal output circuit 51 outputs the drive signal COM generated as described above.

Here, in the following description, a configuration including the amplification control signal generation circuit 502 and the drive signal amplifier circuit 550 included in the integrated circuit 500 may be referred to as a drive signal generation circuit 501 that generates the drive signal COM based on the drive data signal DATA.

The oscillation circuit 410 generates and outputs a clock signal LCK that defines the operation timing of the integrated circuit 500. The clock signal LCK is input to the clock selection circuit 420 and the abnormality detection circuit 430.

Clock signals MCK and LCK and a clock selection signal CSW are input to the clock selection circuit 420. The clock selection circuit 420 switches whether to output the clock signal MCK to the register control circuit 440 as the clock signal RCK based on the logic level of the clock selection signal CSW, or to output the clock signal LCK to the register control circuit 440 as a clock signal RCK. In the present embodiment, it is described that the clock selection circuit 420 outputs the clock signal MCK to the register control circuit 440 as the clock signal RCK when the clock selection signal CSW is at the H level, and outputs the clock signal LCK to the register control circuit 440 as the clock signal RCK when the clock selection signal CSW is at the L level.

The abnormality detection circuit 430 includes an oscillation abnormality detection unit 431, an operation abnormality detection unit 432, and a power supply voltage abnormality detection unit 433.

The oscillation abnormality detection unit 431 receives the clock signal LCK output from the oscillation circuit 410. The oscillation abnormality detection unit 431 detects whether or not the input clock signal LCK is normal, and outputs a logic level clock selection signal CSW and an error signal NES based on the detection result. For example, the oscillation abnormality detection unit 431 detects at least one of the frequency and voltage level of the clock signal LCK. When at least one of the frequency and voltage level of the clock signal LCK is abnormal, the oscillation abnormality detection unit 431 outputs the clock selection signal CSW at the H level to the clock selection circuit 420 and outputs the error signal NES at the H level to the register control circuit 440. In addition, when both the frequency and the voltage level of the clock signal LCK are normal, the oscillation abnormality detection unit 431 outputs the clock selection signal CSW at the L level to the clock selection circuit 420 and outputs the error signal NES at the L level to the register control circuit 440.

An operation status signal ASS indicating the operation states of various configurations of the drive signal output circuit 51 is input to the operation abnormality detection unit 432. The operation abnormality detection unit 432 detects whether or not the various configurations of the drive signal output circuit 51 are operated normally based on the logic level of the input operation status signal ASS. In the present embodiment, when any of the various configurations of the drive signal output circuit 51 is abnormal, the operation status signal ASS at the H level is input to the operation abnormality detection unit 432. When the operation status signal ASS at the H level is input, the operation abnormality detection unit 432 outputs the error signal NES at the H level to the register control circuit 440.

The voltage VHV_TG to be supplied to the liquid ejecting head 21 corresponding to the drive signal output circuit 51 is input to the power supply voltage abnormality detection unit 433. The power supply voltage abnormality detection unit 433 detects the voltage value of the voltage VHV_TG. The power supply voltage abnormality detection unit 433 detects whether or not the voltage level of the voltage VHV_TG to be supplied to the liquid ejecting head 21 is normal based on the voltage value of the voltage VHV_TG. In the present embodiment, when it is determined that the voltage level of the voltage VHV_TG to be supplied to the liquid ejecting head 21 is abnormal, the power supply voltage abnormality detection unit 433 outputs an error signal FES at the H level to the register control circuit 440.

The register control circuit 440 includes a sequence register 441, a status register 442, and a register control unit 443. The sequence register 441 and the status register 442 hold operation information input as the drive data signal DATA in synchronization with the clock signal MCK. The register control unit 443 generates and outputs control signals CNT1 to CNT6 based on the information held in the sequence register 441 and the status register 442 in synchronization with the clock signal RCK. As a result, the operation of the drive signal output circuit 51 is controlled.

Figure 11:
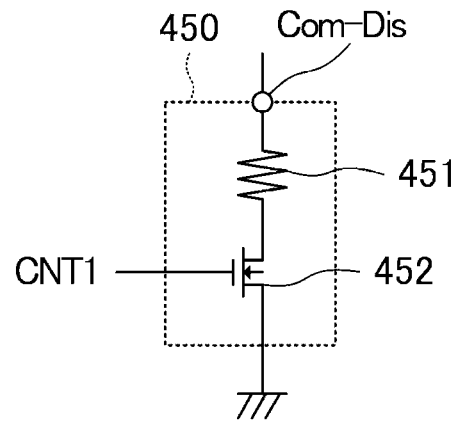
FIG. 11 is a diagram illustrating a configuration of a drive signal discharge circuit.

The control signal CNT1 is input to the drive signal discharge circuit 450. The drive signal discharge circuit 450 controls the output of the drive signal COM output from the drive signal output circuit 51. FIG. 11 is a diagram illustrating a configuration of the drive signal discharge circuit 450. The drive signal discharge circuit 450 includes a resistor 451 and a transistor 452. In the following description, the transistor 452 is described as an NMOS transistor.

One end of the resistor 451 is coupled to a terminal Com-Dis. The other end of the resistor 451 is coupled to a drain terminal of the transistor 452. A source terminal of the transistor 452 is coupled to the ground. In addition, the control signal CNT1 is input to a gate terminal of the transistor 452. When the control signal CNT1 at the L level is input to the drive signal discharge circuit 450 configured as described above, the drive signal discharge circuit 450 releases the charge stored in the terminal Com-Dis. On the other hand, when the control signal CNT1 at the H level is input to the drive signal discharge circuit 450, the drive signal discharge circuit 450 releases the charge stored in the terminal Com-Dis. That is, the drive signal discharge circuit 450 discharges the charge stored in the path through which the drive signal COM is supplied to the liquid ejecting head 21 through the resistors 451 and 555 based on the control signal CNT1.

Figure 12:
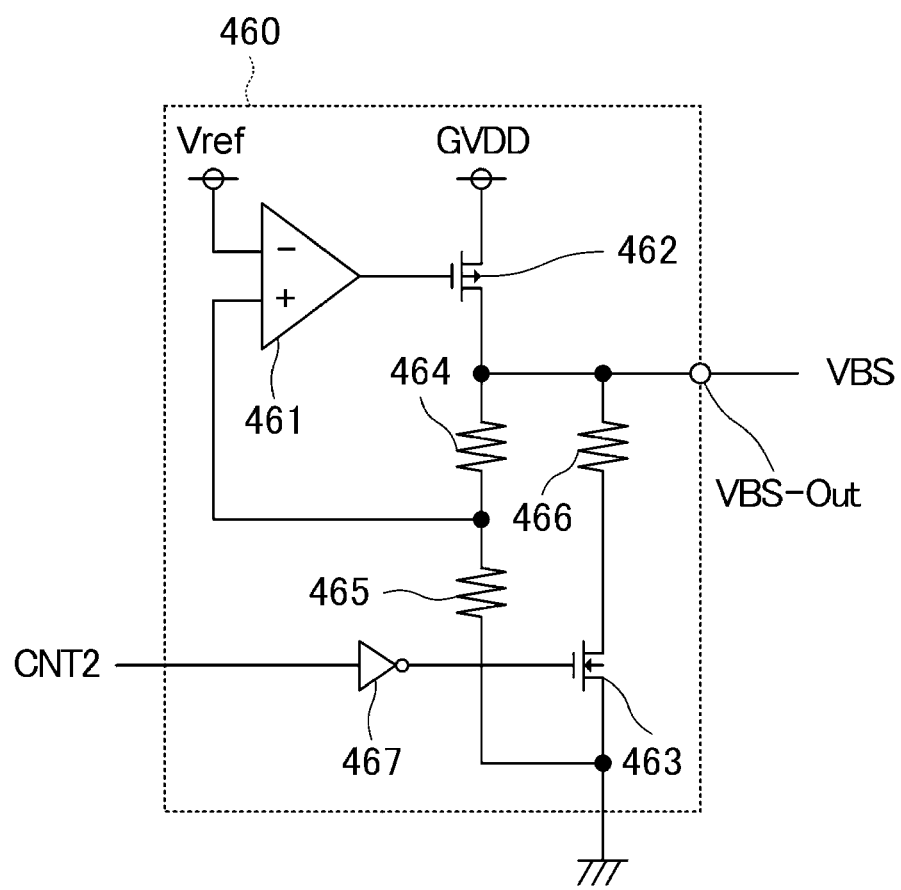
FIG. 12 is a diagram illustrating a configuration of a reference voltage signal output circuit.

The control signal CNT2 is input to the reference voltage signal output circuit 460. The reference voltage signal output circuit 460 generates and outputs a reference voltage signal VBS supplied to the piezoelectric element 60. FIG. 12 is a diagram illustrating a configuration of the reference voltage signal output circuit 460. The reference voltage signal output circuit 460 includes a comparator 461, transistors 462 and 463, resistors 464, 465, and 466, and an inverter 467. In the following description, the transistor 462 is described as a PMOS transistor, and the transistor 463 is described as an NMOS transistor.

A reference voltage Vref is supplied to an input terminal (−) of the comparator 461. In addition, an input terminal (+) of the comparator 461 is coupled commonly to one end of the resistor 464 and one end of the resistor 465. An output terminal of the comparator 461 is coupled to a gate terminal of the transistor 462. A voltage GVDD is supplied to a source terminal of the transistor 462. A drain terminal of the transistor 462 is commonly coupled to the other end of the resistor 464, one end of the resistor 466, and a terminal VBS-Out from which the reference voltage signal VBS is output. The other end of the resistor 466 is coupled to a drain terminal of the transistor 463. The control signal CNT2 is input to a gate terminal of the transistor 463 through the inverter 467. A source terminal of the transistor 463 and the other end of the resistor 465 are coupled to the ground.

In the reference voltage signal output circuit 460 configured as described above, when the voltage supplied to the input terminal (+) of the comparator 461 is larger than the reference voltage Vref supplied to the input terminal (−) of the comparator 461, the comparator 461 outputs the signal at the H level. At this time, the transistor 462 is controlled to be off. Therefore, the voltage GVDD is not supplied to the terminal VBS-Out. On the other hand, when the voltage supplied to the input terminal (+) of the comparator 461 is smaller than the reference voltage Vref supplied to the input terminal (−) of the comparator 461, the comparator 461 outputs the signal at the L level. At this time, the transistor 462 is controlled to be on. Therefore, the voltage GVDD is supplied to the terminal VBS-Out. That is, the reference voltage signal output circuit 460 generates the reference voltage signal VBS having a constant voltage value based on the voltage GVDD when the comparator 461 operates so that the voltage value obtained by dividing the reference voltage signal VBS with the resistors 464 and 465 is equal to the reference voltage Vref.

In addition, when the control signal CNT2 at the H level is input to the reference voltage signal output circuit 460 configured as described above, the transistor 463 is controlled to be non-conductive. Therefore, a path that electrically couples the terminal VBS-Out and the ground through the resistor 466 and the transistor 463 is controlled to a high impedance. As a result, a reference voltage signal VBS having a constant voltage value is output from the terminal VBS-Out. On the other hand, when the control signal CNT2 at the L level is input to the reference voltage signal output circuit 460, the transistor 463 is controlled to be conductive. Therefore, the terminal VBS-Out is electrically coupled to the ground through a resistor 576. As a result, the ground potential reference voltage signal VBS is output. In other words, when the control signal CNT2 at the L level is input to the reference voltage signal output circuit 460, the output of the reference voltage signal VBS is stopped.

Figure 13:
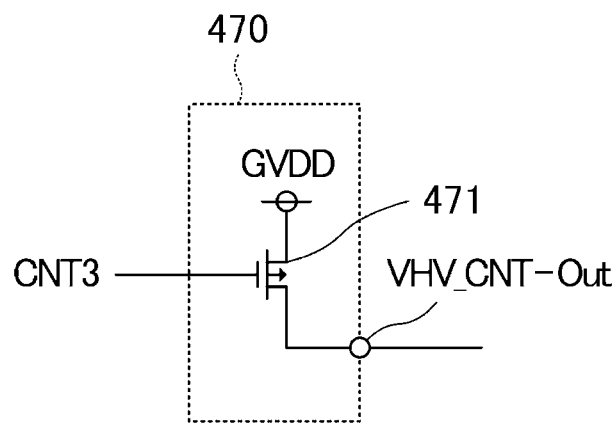
FIG. 13 is a diagram illustrating a configuration of a VHV control signal output circuit.

The control signal CNT3 is input to the VHV control signal output circuit 470. The VHV control signal output circuit 470 outputs a VHV control signal VHV_CNT to be supplied to the power supply voltage control circuit 70. FIG. 13 is a diagram illustrating a configuration of the VHV control signal output circuit 470. The VHV control signal output circuit 470 includes a transistor 471. In the following description, the transistor 471 is described as a PMOS transistor.

The voltage GVDD is supplied to a source terminal of the transistor 471. In addition, a drain terminal of the transistor 471 is coupled to a terminal VHV_CNT-Out. In addition, the control signal CNT3 is input to a gate terminal of the transistor 471. When the control signal CNT3 at the L level is input to the VHV control signal output circuit 470 configured as described above, the voltage GVDD is supplied to the terminal VHV_CNT-Out.

Figure 14:
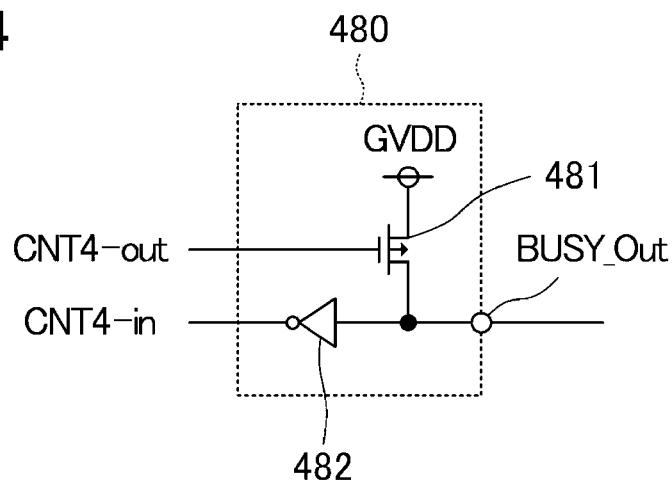
FIG. 14 is a diagram illustrating a configuration of a status signal input and output circuit.

The control signal CNT4 is input to the status signal input and output circuit 480. The status signal input and output circuit 480 outputs a status signal BUSY indicating the operation state of the drive signal output circuit 51. FIG. 14 is a diagram illustrating a configuration of the status signal input and output circuit 480. The status signal input and output circuit 480 includes a transistor 481 and an inverter 482. In the following description, the transistor 481 is described as a PMOS transistor. In addition, the inverter 482 functions as a COMS input terminal of the integrated circuit 500. That is, the status signal input and output circuit 480 outputs the status signal BUSY from a terminal BUSY-Out based on the control signal CNT4 output from the register control circuit 440, and inputs a signal input to the terminal BUSY-Out to the register control circuit 440. In FIG. 14, the control signal CNT4 output from the register control circuit 440 is illustrated as a control signal CNT4-out, and the control signal CNT4 input to the register control circuit 440 is illustrated as a control signal CNT4-in.

The voltage GVDD is supplied to a source terminal of the transistor 481. In addition, a drain terminal of the transistor 481 is coupled to the input terminal of the inverter 482 and the terminal BUSY-Out. In addition, the control signal CNT4-out output from the register control circuit 440 is input to a gate terminal of the transistor 481. In addition, the control signal CNT4-in input to the register control circuit 440 is output from an output terminal of the inverter 482. When the control signal CNT4 at the L level is input to the status signal input and output circuit 480 configured as described above, the voltage GVDD is supplied to the terminal BUSY-Out. That is, the status signal BUSY at the H level is output.

Figure 15:
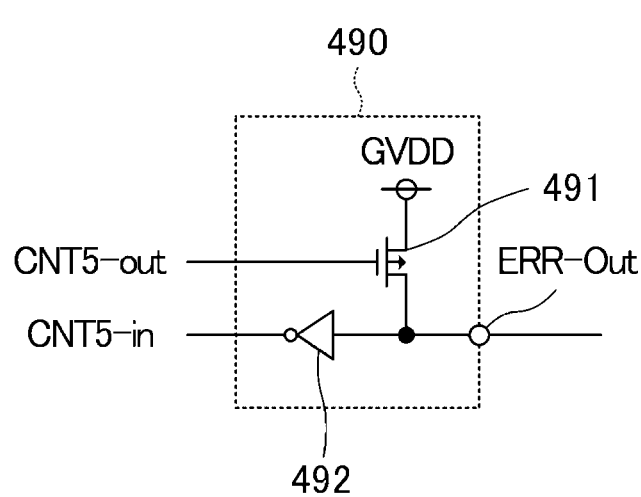
FIG. 15 is a diagram illustrating a configuration of an error signal input and output circuit.

The control signal CNT5 is input to the error signal input and output circuit 490. The error signal input and output circuit 490 outputs an error signal ERR indicating whether or not an abnormality is occurred in the drive signal output circuit 51. FIG. 15 is a diagram illustrating a configuration of the error signal input and output circuit 490. The error signal input and output circuit 490 includes a transistor 491 and an inverter 492. In the following description, the transistor 491 is described as a PMOS transistor. In addition, the inverter 492 functions as a COMS input terminal of the integrated circuit 500. That is, the error signal input and output circuit 490 outputs the error signal ERR from a terminal ERR-Out based on the control signal CNT5 output from the register control circuit 440, and inputs a signal input to the terminal ERR-Out to the register control circuit 440. In FIG. 15, the control signal CNT5 output from the register control circuit 440 is illustrated as a control signal CNT5-out, and the control signal CNT5 input to the register control circuit 440 is illustrated as a control signal CNT5-in.

The voltage GVDD is supplied to a source terminal of the transistor 491. In addition, a drain terminal of the transistor 491 is coupled to an input terminal of the inverter 492 and the terminal ERR-Out. In addition, the control signal CNT5-out output from the register control circuit 440 is input to a gate terminal of the transistor 491. In addition, the control signal CNT5-in input to the register control circuit 440 is output from an output terminal of the inverter 492. When the control signal CNT5 at the L level is input to the error signal input and output circuit 490 configured as described above, the voltage GVDD is supplied to the terminal ERR-Out. That is, the error signal ERR at the H level is output.

The control signal CNT6 is input to the amplification control signal generation circuit 502. When the control signal CNT6 is input to the amplification control signal generation circuit 502, the waveform of the drive signal COM generated by the drive signal generation circuit 501 is defined by the control signal CNT6 regardless of the drive data signal DATA. Specifically, the drive signal generation circuit 501 generates a drive signal COM that is constant at a predetermined voltage value based on the control signal CNT6. In addition, the drive signal generation circuit 501 may generate the drive signal COM that is constant at the ground potential based on the control signal CNT6.

In the drive signal output circuit 51 configured as described above, operation information input as the drive data signal DATA in synchronization with the clock signal MCK is held in the sequence register 441. The register control unit 443 performs sequence control of the drive signal output circuit 51 based on the operation information held in the sequence register 441. When the sequence control is performed, information indicating the operation mode associated with performing of the sequence control is held in the status register 442. The register control circuit 440 controls the output of the control signals CNT1 to CNT6 based on the information indicating the operation mode held in the status register 442. As a result, various signals output from the drive signal output circuit 51 are controlled.

In the following description, in the drive signal output circuit 51, when various configurations and various signals included in the drive signal output circuit 51a are described, "a" may be appended to the end of the reference, and when various configurations and various signals included in the drive signal output circuit 51b are described, "b" may be appended to the end of the reference.

Here, the register control circuit 440a that controls the output of the drive signal COMa included in the drive signal output circuit 51a is an example of a first control circuit, and the abnormality detection circuit 430a that detects an abnormality of the drive signal output circuit 51a is an example of a first abnormality detection circuit. In addition, the integrated circuit 500a including the register control circuit 440a and the operation abnormality detection unit 432a is an example of a first integrated circuit. An oscillation circuit 410a included in the integrated circuit 500a included in the drive signal output circuit 51a is an example of a first oscillation circuit, and a clock signal LCKa output from the oscillation circuit 410a is an example of a first oscillation signal.

Furthermore, the register control circuit 440b that controls the output of the drive signal COMb included in the drive signal output circuit 51b is an example of a second control circuit, and the abnormality detection circuit 430b that detects an abnormality of the drive signal output circuit 51b is an example of a second abnormality detection circuit. In addition, the integrated circuit 500b including the register control circuit 440b and the operation abnormality detection unit 432b is an example of a second integrated circuit. An oscillation circuit 410b included in the integrated circuit 500b included in the drive signal output circuit 51b is an example of a second oscillation circuit, and a clock signal LCKb output from the oscillation circuit 410b is an example of a second oscillation signal.

Returning to FIG. 9, the drive signal output circuit 51a is supplied with the voltage VHV through the fuse 80. Specifically, the voltage VHV is supplied to the drain of the transistor 551a illustrated in FIG. 10. That is, the amplifier circuit configured to include the transistors 551a and 552a is electrically coupled to the fuse 80 and the power supply voltage control circuit 70.

In addition, the voltage VHV_TGa is supplied to the drive signal output circuit 51a. Specifically, the voltage VHV_TGa is supplied to the power supply voltage abnormality detection unit 433 illustrated in FIG. 10. In other words, one end of the fuse 81a is also electrically coupled to the power supply voltage abnormality detection unit 433a in the drive signal output circuit 51a.

The voltage VHV is supplied to the drive signal output circuit 51b through the fuse 80. Specifically, the voltage VHV is supplied to the drain of the transistor 551b illustrated in FIG. 10. That is, the amplifier circuit configured to include the transistors 551b and 552b is electrically coupled to the fuse 80 and the power supply voltage control circuit 70.

In addition, the voltage VHV_TGb is supplied to the drive signal output circuit 51b. Specifically, the voltage VHV_TGb is supplied to the power supply voltage abnormality detection unit 433 illustrated in FIG. 10. In other words, one end of the fuse 81b is also electrically coupled to the power supply voltage abnormality detection unit 433b in the drive signal output circuit 51b.

In addition, the drive signal output circuit 51a generates a VHV control signal VHV_CNTa for controlling the power supply voltage control circuit 70 and outputs the VHV control signal VHV_CNTa to the power supply voltage control circuit 70, and the drive signal output circuit 51b generates a VHV control signal VHV_CNTb for controlling the power supply voltage control circuit 70 and outputs the VHV control signal VHV_CNTb to the power supply voltage control circuit 70. Here, the VHV control signal VHV_CNTa and the VHV control signal VHV_CNTb are propagated through a common wiring, and thereafter supplied to the power supply voltage control circuit 70 as the VHV control signal VHV_CNT. In addition, a resistor 52 is coupled between the wiring through which the VHV control signal VHV_CNT is propagated and the ground. That is, when at least one of the VHV control signal VHV_CNTa and the VHV control signal VHV_CNTb is at the H level, the VHV control signal VHV_CNT at the H level is input to the power supply voltage control circuit 70, and both the VHV control signal VHV_CNTa and the VHV control signal VHV_CNTb are at the L level, the VHV control signal VHV_CNT at the L level is input to the power supply voltage control circuit 70.

In addition, the drive signal output circuit 51a generates an error signal ERRa and outputs the error signal ERRa to the control circuit 100. In addition, the drive signal output circuit 51b generates an error signal ERRb and outputs the error signal ERRb to the control circuit 100. Here, the error signal ERRa and the error signal ERRb are propagated through a common wiring, and thereafter supplied to the control circuit 100 as the error signal ERR. In addition, a resistor 54 is coupled between the wiring through which the error signal ERR is propagated and the ground. That is, when at least one of the error signal ERRa and the error signal ERRb is at the H level, the error signal ERR at the H level is input to the control circuit 100, and when both the error signal ERRa and the error signal ERRb are at the L level, the error signal ERR at the L level is input to the control circuit 100.

Furthermore, the error signal ERRa is also input to the drive signal output circuit 51b. Similarly, the error signal ERRb is also input to the drive signal output circuit 51a. That is, when the operation abnormality detection unit 432a detects an operation abnormality of the drive signal output circuit 51a, the drive signal output circuit 51a transmits the occurrence of the abnormality to the drive signal output circuit 51b using the error signal ERRa, when the operation abnormality detection unit 432b detects an operation abnormality of the drive signal output circuit 51b, the drive signal output circuit 51b transmits the occurrence of the abnormality to the drive signal output circuit 51a using the error signal ERRb.

In addition, the drive signal output circuit 51a generates a status signal BUSYa it to the control circuit 100. In addition, the drive signal output circuit 51b generates a status signal BUSYb and outputs the status signal BUSYb to the control circuit 100. Here, the status signal BUSYa and the status signal BUSYb are propagated through a common wiring, and thereafter supplied to the control circuit 100 as the status signal BUSY. In addition, a resistor 53 is coupled between the wiring through which the status signal BUSY is propagated and the ground. That is, when at least one of the status signal BUSYa and the status signal BUSYb is at the H level, the status signal BUSY at the H level is input to the control circuit 100, and when both the status signal BUSYa and the status signal BUSYb are at the L level, the status signal BUSY at the L level is input to the control circuit 100.

Furthermore, the status signal BUSYa is also input to the drive signal output circuit 51b. Similarly, the status signal BUSYb is also input to the drive signal output circuit 51a. That is, the drive signal output circuit 51a transmits the processing state of the drive signal output circuit 51a to the drive signal output circuit 51b, and the drive signal output circuit 51b transmits the processing state of the drive signal output circuit 51b to the drive signal output circuit 51a.

As described above, the drive circuit 50 according to the present embodiment includes the drive signal output circuit 51a that outputs the drive signal COMa to the liquid ejecting head 21a and the drive signal output circuit 51b that outputs the drive signal COMb to the liquid ejecting head 21b. When an abnormality occurs in any one of the drive signal output circuits 51a and 51b, the abnormality is transmitted to the other of the drive signal output circuits 51a and 51b. Furthermore, the processing state of any one of the drive signal output circuits 51a and 51b is transmitted to the other of the drive signal output circuits 51a and 51b.

Therefore, in the drive circuit 50, the operation of the drive circuit 50 when an abnormality is detected in either the drive signal output circuit 51a or the drive signal output circuit 51b will be described with reference to FIGS. 16 to 18. The operations when the abnormality is detected in the drive signal output circuit 51a and when the abnormality is detected in the drive signal output circuit 51b are the same as each other. Therefore, in the description of FIGS. 16 to 18, the operation of the drive circuit 50 when the abnormality is detected in the drive signal output circuit 51a will be described, and the description of the operation of the drive circuit 50 when the abnormality is detected in the drive signal output circuit 51b will be omitted. In addition, in FIGS. 16 to 18, the operation mode of the drive signal output circuit 51a defined by the register control circuit 440a is illustrated as a state AMa, and the operation mode of the drive signal output circuit 51b defined by the register control circuit 440b is illustrated as a state AMb.

Figure 16:
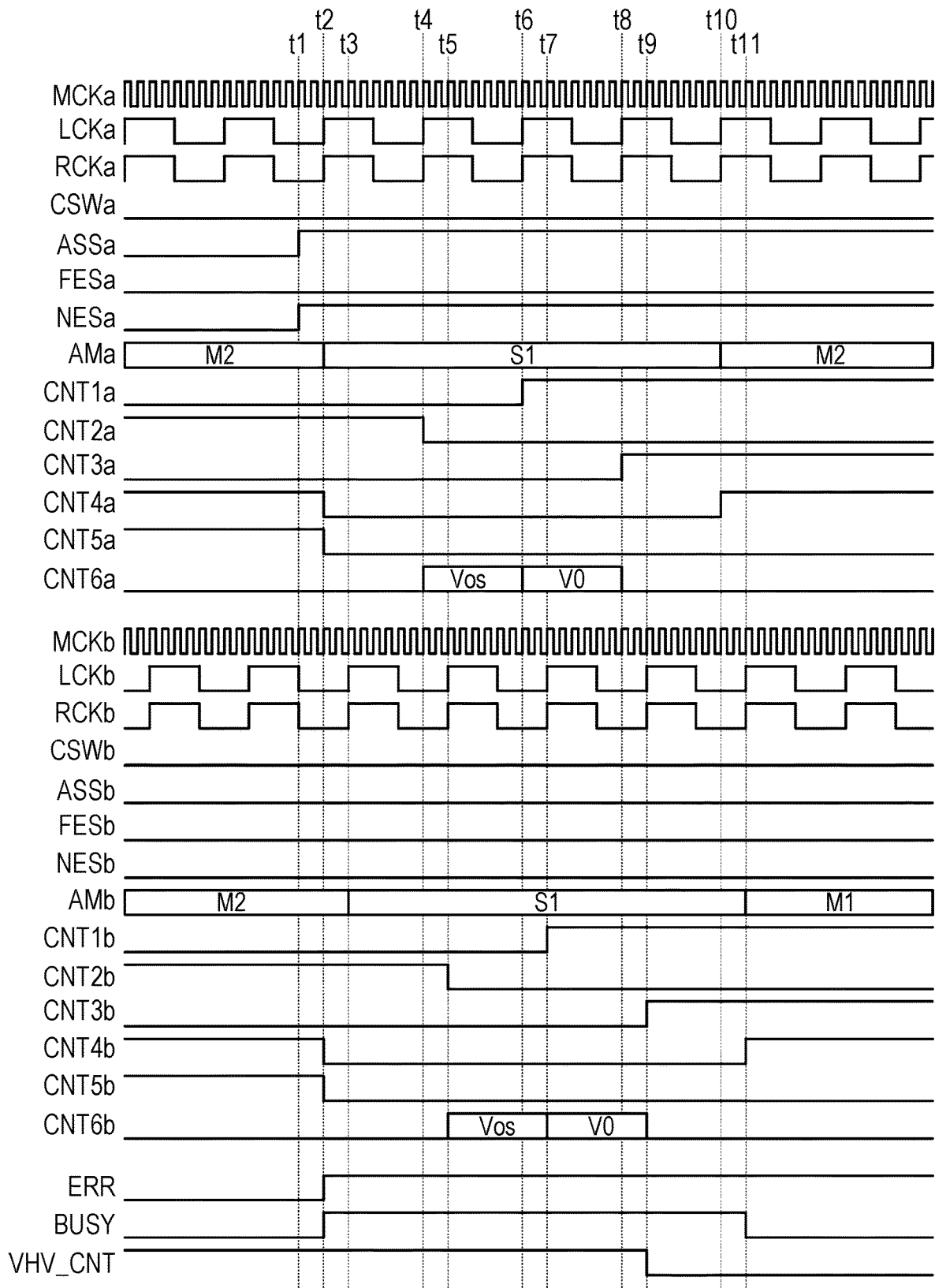
FIG. 16 is a timing chart for describing an operation of the drive circuit when an operation abnormality of the drive signal output circuit is detected by an operation abnormality detection unit.

FIG. 16 is a timing chart for describing an operation of the drive circuit 50 when an operation abnormality of the drive signal output circuit 51a is detected by the operation abnormality detection unit 432a. Here, examples of the operation abnormality detected by the drive signal output circuit 51a include an abnormality in the voltage value generated by the voltage generation circuit 400 and an abnormality in the input drive data signal DATAa.

As illustrated in FIG. 16, when an operation status signal ASSa at the H level indicating that an operation abnormality is occurred in the drive signal output circuit 51a is input to the operation abnormality detection unit 432a at time t1, the operation abnormality detection unit 432a sets the logic level of the error signal NESa to the H level indicating that the operation abnormality is occurred in the drive signal output circuit 51a.

At time t2, the register control circuit 440a changes the operation mode of the drive signal output circuit 51a from a drive mode M1 to an abnormal stop sequence S1. At this time, the register control circuit 440a switches the logic level of the control signals CNT4a and CNT5a from the H level to the L level. Therefore, the status signal BUSYa and the error signal ERRa output from the drive signal output circuit 51a are at the H level.

When the status signal BUSYa and the error signal ERRa output from the drive signal output circuit 51a are set to the H level, the status signal BUSYa and the error signal ERRa at the H level are input to the drive signal output circuit 51b. As a result, control signals CNT4b and CNT5b are H level. In addition, when the status signal BUSYa and the error signal ERRa output from the drive signal output circuit 51a are H level, the error signal ERR and the status signal BUSY input to the control circuit 100 also are H level.

At time t3, in the register control circuit 440b, the control signals CNT4 and CNT5 at the H level are input to the drive signal output circuit 51b, so that the operation mode of the drive signal output circuit 51b changes from the drive mode M1 to the abnormal stop sequence S1.

At time t4, the drive signal output circuit 51a changes to the abnormal stop sequence S1, so that the register control circuit 440a sets a control signal CNT2a to the L level. At this time, the register control circuit 440a also outputs a control signal CNT6a for controlling the drive signal generation circuit 501a to output the voltage Vos having a constant voltage value as the drive signal COMa.

At time t6, the register control circuit 440a sets a control signal CNT1a to the H level. At this time, the register control circuit 440a also outputs the control signal CNT6a for controlling the drive signal generation circuit 501a to output the voltage V0, which is the ground potential, as the drive signal COMa. Thereafter, at time t8, the register control circuit 440a sets a control signal CNT3a to the H level. At time t10, the register control circuit 440a changes the operation mode of the drive signal output circuit 51a from the abnormal stop sequence S1 to a sleep mode M2.

At time t5, when the drive signal output circuit 51b changes to the abnormal stop sequence S1, the register control circuit 440b sets a control signal CNT2b to the L level. At this time, the register control circuit 440b also outputs a control signal CNT6b for controlling the drive signal generation circuit 501b to output the voltage Vos having a constant voltage value as the drive signal COMb.

At time t7, the register control circuit 440b sets a control signal CNT1b to the H level. At this time, the register control circuit 440b also outputs the control signal CNT6b for controlling the drive signal generation circuit 501b to output the voltage V0, which is the ground potential, as the drive signal COMb. Thereafter, at time t9, the register control circuit 440b sets a control signal CNT3b to the H level. At time t11, the register control circuit 440b changes the operation mode of the drive signal output circuit 51b from the abnormal stop sequence S1 to the sleep mode M2.

The drive signal output circuit 51a operates based on the clock signal LCKa supplied as the clock signal RCKa in the abnormal stop sequence S1. In addition, the drive signal output circuit 51b operates based on the clock signal LCKb supplied as the clock signal RCKb in the abnormal stop sequence S1. That is, the drive signal output circuit 51a and the drive signal output circuit 51b operate independently according to different clocks. Therefore, in FIG. 16, the timings of processing at times t4, t6, t8, and t10 when the drive signal output circuit 51a is controlled and times t5, t7, t9, and t11 when the drive signal output circuit 51b is controlled are not limited to the timing illustrated in FIG. 16.

As described above, when the operation abnormality detection unit 432a included in the abnormality detection circuit 430a detects the operation abnormality, the register control circuit 440a performs control to stop the output of the drive signal COMa. When the occurrence of abnormality is transmitted from the drive signal output circuit 51a to the drive signal output circuit 51b, the register control circuit 440b performs control to stop the output of the drive signal COMb. In this case, the register control circuit 440a performs control to stop the output of the drive signal COMa based on the clock signal LCKa.

In addition, although not described, when the operation abnormality detection unit 432b included in the abnormality detection circuit 430b detects an operation abnormality, the register control circuit 440b performs control to stop the output of the drive signal COMb. When the occurrence of abnormality is transmitted from the drive signal output circuit 51b to the drive signal output circuit 51a, the register control circuit 440a performs control to stop the output of the drive signal COMa. In this case, the register control circuit 440b performs control to stop the output of the drive signal COMb based on the clock signal LCKb.

Figure 17:
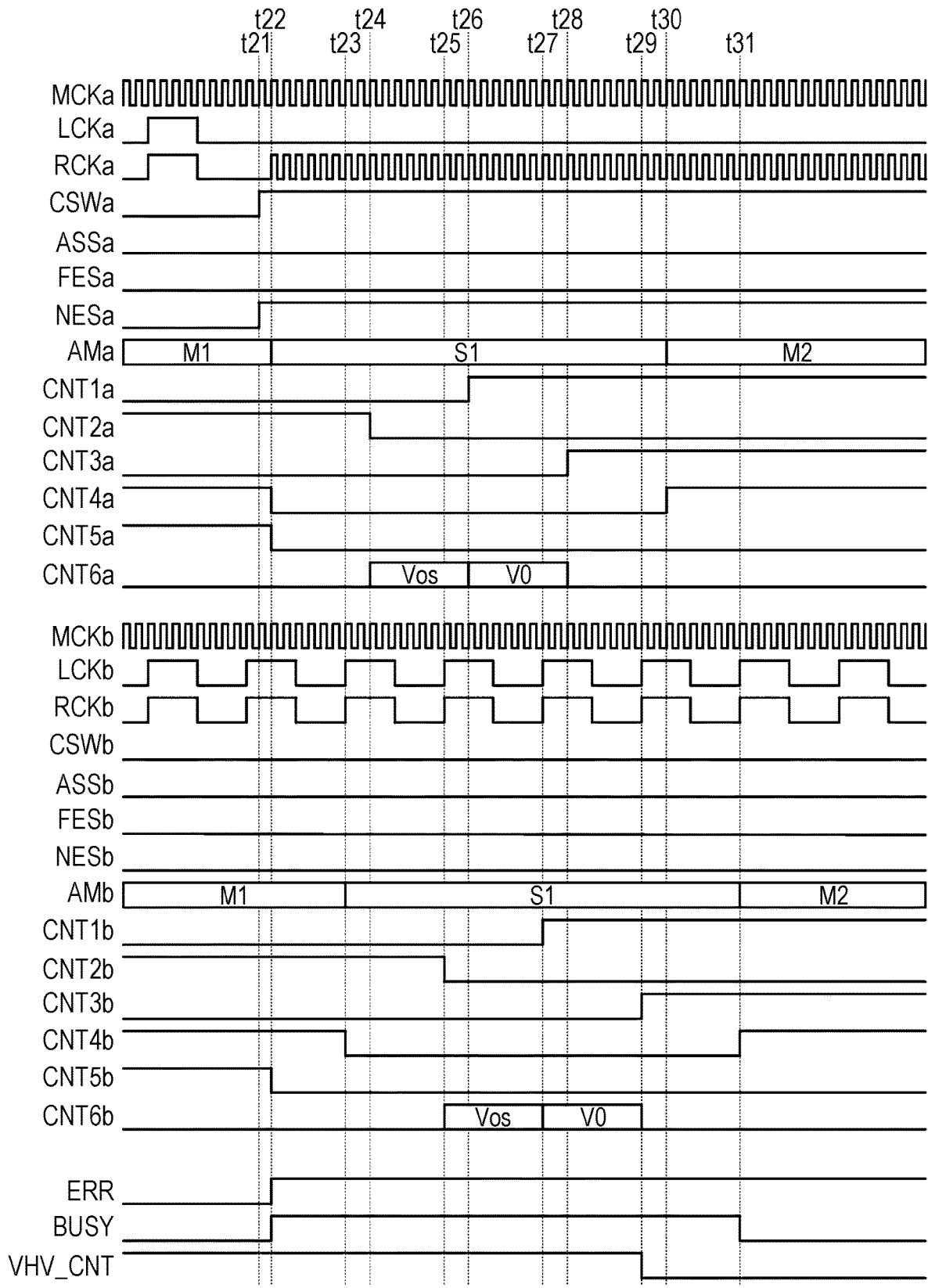
FIG. 17 is a timing chart illustrating an operation of the drive circuit when an oscillation stop abnormality occurs in a clock signal LCK output from an oscillation circuit in an oscillation abnormality detection unit.

FIG. 17 is a timing chart illustrating an operation of the drive circuit 50 when an oscillation stop abnormality occurs in the clock signal LCK output from the oscillation circuit 410a in the oscillation abnormality detection unit 431a.

As illustrated in FIG. 17, when the oscillation abnormality detection unit 431a detects that the operation abnormality is occurred in the clock signal LCK at time t21, the oscillation abnormality detection unit 431a sets the logic level of the error signal NESa to H level indicating that the operation abnormality is occurred in the drive signal output circuit 51a, and sets the clock selection signal CSW to H level. As a result, the clock selection circuit 420a selects the clock signal MCK as the clock signal RCK and inputs the clock signal MCK to the register control circuit 440.

At time t22, the register control circuit 440a changes the operation mode of the drive signal output circuit 51a from the drive mode M1 to the abnormal stop sequence S1 based on the clock signal MCK input as the clock signal RCK. At this time, the register control circuit 440a switches the logic level of the control signals CNT4a and CNT5a from the H level to the L level. Therefore, the status signal BUSYa and the error signal ERRa output from the drive signal output circuit 51a are at the H level.

When the status signal BUSYa and the error signal ERRa output from the drive signal output circuit 51a are set to the H level, the status signal BUSYa and the error signal ERRa at the H level are input to the drive signal output circuit 51b. As a result, the control signals CNT4b and CNT5b are H level. In addition, when the status signal BUSYa and the error signal ERRa output from the drive signal output circuit 51a are H level, the error signal ERR and the status signal BUSY input to the control circuit 100 also are H level.

At time t23, since the register control circuit 440b inputs the control signals CNT4 and CNT5 at the H level to the drive signal output circuit 51b, the operation mode of the drive signal output circuit 51b changes from the drive mode M1 to the abnormal stop sequence S1. Thereafter, from time t23 to time t31, the drive signal output circuits 51a and 51b perform the same processing as from time t3 to time t11 illustrated in FIG. 16.

As described above, when the oscillation abnormality detection unit 431a included in the abnormality detection circuit 430a detects an abnormality in which the output of the clock signal LCKa stops, the register control circuit 440a performs control to stop the output of the drive signal COMa based on a clock signal MCKa. In this case, when the oscillation abnormality detection unit 431b included in the abnormality detection circuit 430b does not detect an abnormality in which the output of the clock signal LCKb stops, the register control circuit 440b performs control to stop the output of the drive signal COMb based on the clock signal LCKb.

In addition, although not described, when the oscillation abnormality detection unit 431b included in the abnormality detection circuit 430b detects an abnormality in which the output of the clock signal LCKb stops, the register control circuit 440b performs control to stop the output of the drive signal COMb based on a clock signal MCKb. In this case, when the oscillation abnormality detection unit 431a included in the abnormality detection circuit 430a does not detect the abnormality in which the output of the clock signal LCKa stops, the register control circuit 440a performs control to stop the output of the drive signal COMa based on the clock signal LCKa.

Figure 18:
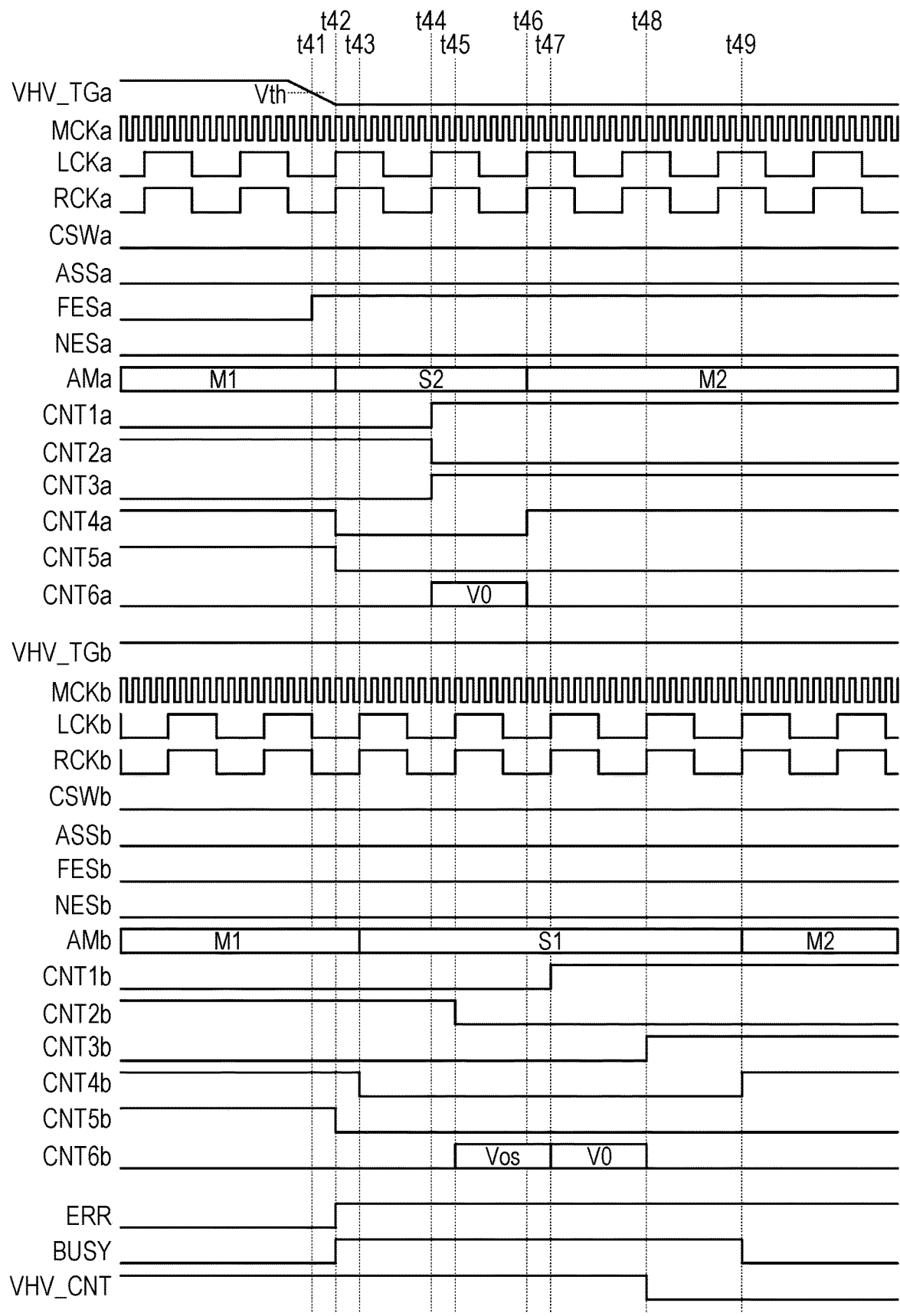
FIG. 18 is a timing chart illustrating an operation of the drive circuit when an abnormality occurs in a voltage value of a voltage VHV_TGa in a power supply voltage abnormality detection unit.

FIG. 18 is a timing chart illustrating an operation of the drive circuit 50 when an abnormality occurs in the voltage value of the voltage VHV_TGa in the power supply voltage abnormality detection unit 433a. Here, examples of factors that causes an abnormality in the voltage value of the voltage VHV_TGa include blowing of the fuse 81a due to overcurrent.

As illustrated in FIG. 18, when the voltage value of the voltage VHV_TGa falls below a predetermined threshold value Vth at time t41, the power supply voltage abnormality detection unit 433a sets the logic level of the error signal FESa to H level, assuming that the abnormality is occurred in the voltage VHV_TGa.

At time t42, the register control circuit 440a changes the operation mode of the drive signal output circuit 51a from the drive mode M1 to an emergency abnormal stop sequence S2 based on the clock signal MCK input as the clock signal RCK. At this time, the register control circuit 440a switches the logic level of the control signals CNT4a and CNT5a from the H level to the L level. Therefore, the status signal BUSYa and the error signal ERRa output from the drive signal output circuit 51a are at the H level. Here, the emergency abnormal stop sequence S2 is an operation mode that changes when the abnormality which may cause a failure in the liquid ejecting head 21 such as blowing of the fuse due to overcurrent and abnormal information held in the register control circuit 440 is detected. The emergency abnormal stop sequence S2 is an operation mode that can reduce the possibility that the failure occurs in the liquid ejecting head 21 and reduce the possibility that an influence associated with the abnormality occurs in the different liquid ejecting heads 21 by stopping the operation of the drive signal output circuit 51 corresponding to the liquid ejecting head 21 which may fail in a short time.

When the status signal BUSYa and the error signal ERRa output from the drive signal output circuit 51a are set to the H level, the status signal BUSYa and the error signal ERRa at the H level are input to the drive signal output circuit 51b. As a result, the control signals CNT4b and CNT5b are H level. In addition, when the status signal BUSYa and the error signal ERRa output from the drive signal output circuit 51a are H level, the error signal ERR and the status signal BUSY input to the control circuit 100 also are H level.

At time t43, the register control circuit 440b receives the control signals CNT4 and CNT5 at the H level in the drive signal output circuit 51b, so that the operation mode of the drive signal output circuit 51b changes from the drive mode M1 to the abnormal stop sequence S1. At times t45 and t47 to t49, the drive signal output circuit 51b performs the same processing as at times t5, t7, t9, and t11 illustrated in FIG. 16.

At time t44, the register control circuit 440a sets each of the control signals CNT1a, CNT2a, and CNT3a to the H, L, and H levels. In addition, the register control circuit 440a also outputs the control signal CNT6a that controls the drive signal generation circuit 501a to output the voltage V0, which is the ground potential, as the drive signal COMa. As a result, in the emergency abnormal stop sequence S2, it is possible to stop the supply of the reference voltage signal VBSa and the drive signal COMa supplied to the liquid ejecting head 21a in a short time compared to the abnormal stop sequence S1.

At time t46, the register control circuit 440a changes the operation mode of the drive signal output circuit 51a from the emergency abnormal stop sequence S2 to the sleep mode M2. As described above, when the abnormality that may cause the liquid ejecting head 21a to fail is detected, the drive signal output circuit 51a corresponding to the liquid ejecting head 21a sets the logic levels of each of the control signals CNT1 to CNT3 to H, L, and H levels in a short time. The drive signal generation circuit 501a outputs the control signal CNT6a that controls the voltage V0, which is the ground potential, to be output as the drive signal COMa. As a result, the supply of the voltage VHV can be stopped in a short time, and the operation of the drive signal output circuit 51b and the liquid ejecting head 21 corresponding to the drive signal output circuit 51b can be stopped.

In addition, as illustrated in the present embodiment, the drive signal output circuit 51b controls the operation of the power supply voltage control circuit 70 based on the detection result of the power supply voltage in the power supply voltage abnormality detection unit 433a, so that the drive signal output circuit 51b can stop the operation according to the abnormal stop sequence S1. As a result, it is possible to reduce the possibility that an excessive load is applied to the liquid ejecting head 21b due to the voltage VHV, the reference voltage signal VBS, and the drive signal COM. Therefore, it is possible to further reduce the possibility that an influence associated with the abnormality occurs in the drive signal output circuit 51b in which no abnormality is occurred and the liquid ejecting head 21b.

5. Effects

As described above, the drive circuit 50 according to the present embodiment is provided with the drive signal output circuit 51a including the register control circuit 440a for controlling the output of the drive signal COMa and the abnormality detection circuit 430a for detecting the abnormality of the drive signal output circuit 51a, and the drive signal output circuit 51b including the register control circuit 440b for controlling the output of the drive signal COMb and the abnormality detection circuit 430b for detecting the abnormality of the drive signal output circuit 51b. When the abnormality detection circuit 430a detects the abnormality, the drive signal output circuit 51a transmits the occurrence of the abnormality to the drive signal output circuit 51b. When the abnormality detection circuit 430b detects the abnormality, the drive signal output circuit 51b transmits the occurrence of the abnormality to the drive signal output circuit 51a. As a result, it is possible to transmit that the abnormality is occurred in one of the drive signal output circuits 51a and 51b to the other drive signal output circuit 51a and 51b in which no abnormality is occurred. Therefore, it is possible to control the other drive signal output circuits 51a and 51b in which no abnormality is occurred, based on the information indicating the occurrence of the voltage abnormality.

In addition, in the drive circuit 50 according to the present embodiment, when the abnormality detection circuit 430a detects the abnormality, the register control circuit 440a performs control to stop the output of the drive signal COMa, and when the abnormality detection circuit 430b detects the abnormality, the register control circuit 440b performs control to stop the output of the drive signal COMb. As described above, when the abnormality occurs in one of the drive signal output circuits 51a and 51b, one of the drive signal output circuits 51a and 51b in which the abnormality occurs stops the own output based on the abnormality, so that it is possible to shorten the time required for abnormal stop of one of the drive signal output circuits 51a and 51b. Therefore, the safety of the drive circuit 50 can be improved.

In addition, in the drive circuit 50 according to the present embodiment, when the abnormality detection circuit 430a detects the abnormality and the occurrence of abnormality is transmitted from the drive signal output circuit 51a to the drive signal output circuit 51b, the register control circuit 440b performs control to stop the output of the drive signal COMb. When the abnormality detection circuit 430b detects the abnormality and the occurrence of abnormality is transmitted from the drive signal output circuit 51b to the drive signal output circuit 51a, the register control circuit 440a performs control to stop the output of the drive signal COMa. That is, the drive circuit 50 stops the output of the other drive signal output circuits 51a and 51b in which no abnormality is occurred when it is transmitted that the abnormality is occurred in one of the drive signal output circuits 51a and 51b. As a result, it is possible to reduce the possibility of the influence of the abnormality affecting the other drive signal output circuits 51a and 51b in which no abnormality is occurred.

In addition, in the drive circuit 50, the register control circuit 440a performs control to stop the output of the drive signal COMa based on the clock signal LCKa output from the oscillation circuit 410a that generates an internal clock of the integrated circuit 500a including the register control circuit 440a. The register control circuit 440b performs control to stop the output of the drive signal COMa based on the clock signal LCKb output from the oscillation circuit 410b that generates an internal clock of the integrated circuit 500b including the register control circuit 440b. In this manner, when the drive circuit 50 detects the abnormality, by performing stop control associated with the abnormality with the internal clocks of the integrated circuits 500a and 500b, it is possible to reduce the possibility that disturbance noise or the like affects the stop processing.

In addition, in the drive circuit 50 according to the present embodiment, when the abnormality detection circuit 430a detects the abnormality in which the output of the clock signal LCKa stops, the register control circuit 440a performs control to stop the output of the drive signal COMa based on the clock signal MCK supplied from the outside of the drive circuit 50. When the abnormality detection circuit 430b detects the abnormality in which the output of the clock signal LCKb stops, the register control circuit 440b performs control to stop the output of the drive signal COMb based on the clock signal MCK supplied from the outside of the drive circuit 50. As described above, even when the clock signals LCKa and LCKb that functioned as operation clocks are stopped, the register control circuits 440a and 440b can perform stop processing associated with the abnormality in different clock signals MCK input from the outside, and can reduce the possibility that the abnormality detection in the drive circuit 50 does not operate.

6. Modified Example

The liquid ejecting apparatus 1 described above is described as a so-called serial type ink jet printer in which the liquid ejecting head 21 ejecting the ink is mounted on the carriage 24 and the carriage 24 reciprocates on the medium P to perform printing, and may be a so-called line type ink jet printer in which the liquid ejecting head 21 is disposed in the width direction of the medium P and the medium P is transported to perform printing.

Hereinbefore, although embodiment and the modification are described, this disclosure is not limited to these embodiments, and it is possible to implement in various aspects without departing from the gist. For example, the above-described embodiment can be appropriately combined.

The present disclosure includes configurations that are substantially the same as the configurations described in the embodiment (for example, configurations that have the same functions, methods, and results, or configurations that have the same objects and effects). In addition, the present disclosure includes a configuration in which a non-essential part of the configuration described in the embodiment is replaced. In addition, the present disclosure includes a configuration that exhibits the same operational effects as the configuration described in the embodiment or a configuration that can achieve the same object. In addition, the present disclosure includes a configuration in which a known technique is added to the configuration described in the embodiment.

What is claimed is:

1. A drive circuit comprising:
a first drive signal output circuit that outputs a first drive signal for driving a first piezoelectric element; and
a second drive signal output circuit that outputs a second drive signal for driving a second piezoelectric element, wherein
the first drive signal output circuit includes
a first control circuit that controls an output of the first drive signal, and
a first abnormality detection circuit that detects an abnormality in the first drive signal output circuit,
the second drive signal output circuit includes
a second control circuit that controls an output of the second drive signal, and
a second abnormality detection circuit that detects an abnormality in the second drive signal output circuit,
the first drive signal output circuit transmits an occurrence of abnormality to the second drive signal output circuit, when the first abnormality detection circuit detects the abnormality, and
the second drive signal output circuit transmits an occurrence of abnormality to the first drive signal output circuit, when the second abnormality detection circuit detects the abnormality.

2. The drive circuit according to claim 1, wherein
the first control circuit performs control to stop the output of the first drive signal, when the first abnormality detection circuit detects the abnormality, and
the second control circuit performs control to stop the output of the second drive signal, when the second abnormality detection circuit detects the abnormality.

3. The drive circuit according to claim 1, wherein
the second control circuit performs control to stop the output of the second drive signal, when the first abnormality detection circuit detects the abnormality and the occurrence of abnormality is transmitted from the first drive signal output circuit to the second drive signal output circuit, and
the first control circuit performs control to stop the output of the first drive signal, when the second abnormality detection circuit detects the abnormality and the occurrence of abnormality is transmitted from the second drive signal output circuit to the first drive signal output circuit.

4. The drive circuit according to claim 1, wherein
the first control circuit and the first abnormality detection circuit are provided in a first integrated circuit, and
the second control circuit and the second abnormality detection circuit are provided in a second integrated circuit.

5. The drive circuit according to claim 4, wherein
the first integrated circuit includes a first oscillation circuit that outputs a first oscillation signal,
the second integrated circuit includes a second oscillation circuit that outputs a second oscillation signal,
the first control circuit performs control to stop the output of the first drive signal based on the first oscillation signal, and
the second control circuit performs control to stop the output of the second drive signal based on the second oscillation signal.

6. The drive circuit according to claim 5, further comprising:
a third oscillation circuit that outputs a third oscillation signal, wherein
the first control circuit performs control to stop the output of the first drive signal based on the third oscillation signal, when the first abnormality detection circuit detects an abnormality in which an output of the first oscillation signal is stopped, and
the second control circuit performs control to stop the output of the second drive signal based on the third oscillation signal, when the second abnormality detection circuit detects an abnormality in which an output of the second oscillation signal is stopped.

7. The drive circuit according to claim 1, wherein
the first drive signal output circuit transmits a processing state of the first drive signal output circuit to the second drive signal output circuit, and
the second drive signal output circuit transmits a processing state of the second drive signal output circuit to the first drive signal output circuit.

8. A liquid ejecting apparatus comprising:
the drive circuit according to claim 1; and
a print head that includes the first piezoelectric element and the second piezoelectric element, and ejects a liquid by driving at least one of the first piezoelectric element and the second piezoelectric element.

* * * * *